US012616041B2

(12) United States Patent
Liao

(10) Patent No.: US 12,616,041 B2
(45) Date of Patent: Apr. 28, 2026

(54) SEMICONDUCTOR AND METHOD FOR FORMING THE SAME

(71) Applicant: Taiwan Semiconductor Manufacturing Company, Ltd., Hsinchu (TW)

(72) Inventor: Wen-Shiang Liao, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 546 days.

(21) Appl. No.: 18/150,455

(22) Filed: Jan. 5, 2023

(65) Prior Publication Data

US 2024/0128196 A1      Apr. 18, 2024

Related U.S. Application Data

(60) Provisional application No. 63/416,122, filed on Oct. 14, 2022.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 23/642* (2013.01); *H01L 24/08* (2013.01); *H01L 24/80* (2013.01); *H01L 2224/08225* (2013.01);
(Continued)

(58) Field of Classification Search
CPC ............. H01L 23/5389; H01L 21/4857; H01L 21/565; H01L 23/3128; H01L 23/5383; H01L 23/5386; H01L 23/642; H01L 24/08; H01L 24/80; H01L 2224/08225; H01L 2224/80895; H01L 2224/80896; H01L 2924/19041; H01L 2924/19105
USPC ........................................................ 257/668
See application file for complete search history.

(56) References Cited

U.S. PATENT DOCUMENTS 8,993,380 B2      3/2015  Hou et al.
8,994,183 B2 *   3/2015  Iwasaki ............... H01L 23/5226
                                                                         438/622
(Continued)

FOREIGN PATENT DOCUMENTS

KR           102716252 B1 * 10/2024  ......... H01L 23/5386

*Primary Examiner* — Kwin Xie
(74) *Attorney, Agent, or Firm* — Birch, Stewart, Kolasch & Birch, LLP

(57) ABSTRACT

A semiconductor structure is provided. The semiconductor structure includes a substrate, a first conductive layer formed on the substrate, a chip disposed on the substrate, a first dielectric layer surrounding the chip, a second conductive layer disposed on the first dielectric layer and electrically insulated from the first conductive layer, a plurality of first vias formed in the first dielectric layer and electrically connected to the first conductive layer, and a plurality of second vias formed in the first dielectric layer and electrically connected to the second conductive layer. The first vias are arranged in a first direction. The second vias are arranged in the first direction, and the first vias and the second vias are arranged in a staggered fashion in a second direction, which is different from the first direction.

20 Claims, 32 Drawing Sheets

(51) Int. Cl.
　　*H01L 21/56* 　　　(2006.01)
　　*H01L 23/00* 　　　(2006.01)
　　*H01L 23/31* 　　　(2006.01)
　　*H01L 23/64* 　　　(2006.01)

(52) U.S. Cl.
　　CPC .............. *H01L 2224/80895* (2013.01); *H01L 2224/80896* (2013.01); *H01L 2924/19041* (2013.01); *H01L 2924/19105* (2013.01)

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,502,333 B2 * | 11/2016 | Lee ................... H01L 23/49827 | |
| 9,666,502 B2 | 5/2017 | Chen et al. | |
| 9,735,131 B2 | 8/2017 | Su et al. | |
| 2005/0156319 A1 * | 7/2005 | Oggioni ................. H01L 23/66 | 257/774 |
| 2008/0295325 A1 * | 12/2008 | Muthukumar ........ H01L 21/486 | 29/830 |
| 2015/0371947 A1 * | 12/2015 | Chen ....................... H01L 24/25 | 257/774 |
| 2018/0158771 A1 * | 6/2018 | Akiba ................... H01L 23/528 | |
| 2019/0123092 A1 | 4/2019 | Lin et al. | |
| 2019/0333859 A1 * | 10/2019 | Saugier ............. H01L 23/49844 | |
| 2020/0066635 A1 | 2/2020 | Liang et al. | |
| 2021/0183766 A1 | 6/2021 | Kim et al. | |
| 2021/0225812 A1 | 7/2021 | Yu et al. | |
| 2023/0301111 A1 * | 9/2023 | Yamada ................. H01L 25/50 | 257/777 |
| 2023/0352382 A1 * | 11/2023 | Karashima ......... H01L 23/3128 | |

* cited by examiner

SEMICONDUCTOR AND METHOD FOR FORMING THE SAME

PRIORITY CLAIM AND CROSS-REFERENCE

This application claims priority to U.S. Provisional Application Ser. No. 63/416,122, filed on Oct. 14, 2022, the entirety of which is incorporated by reference herein.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

Although existing package structures and methods of fabricating package structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
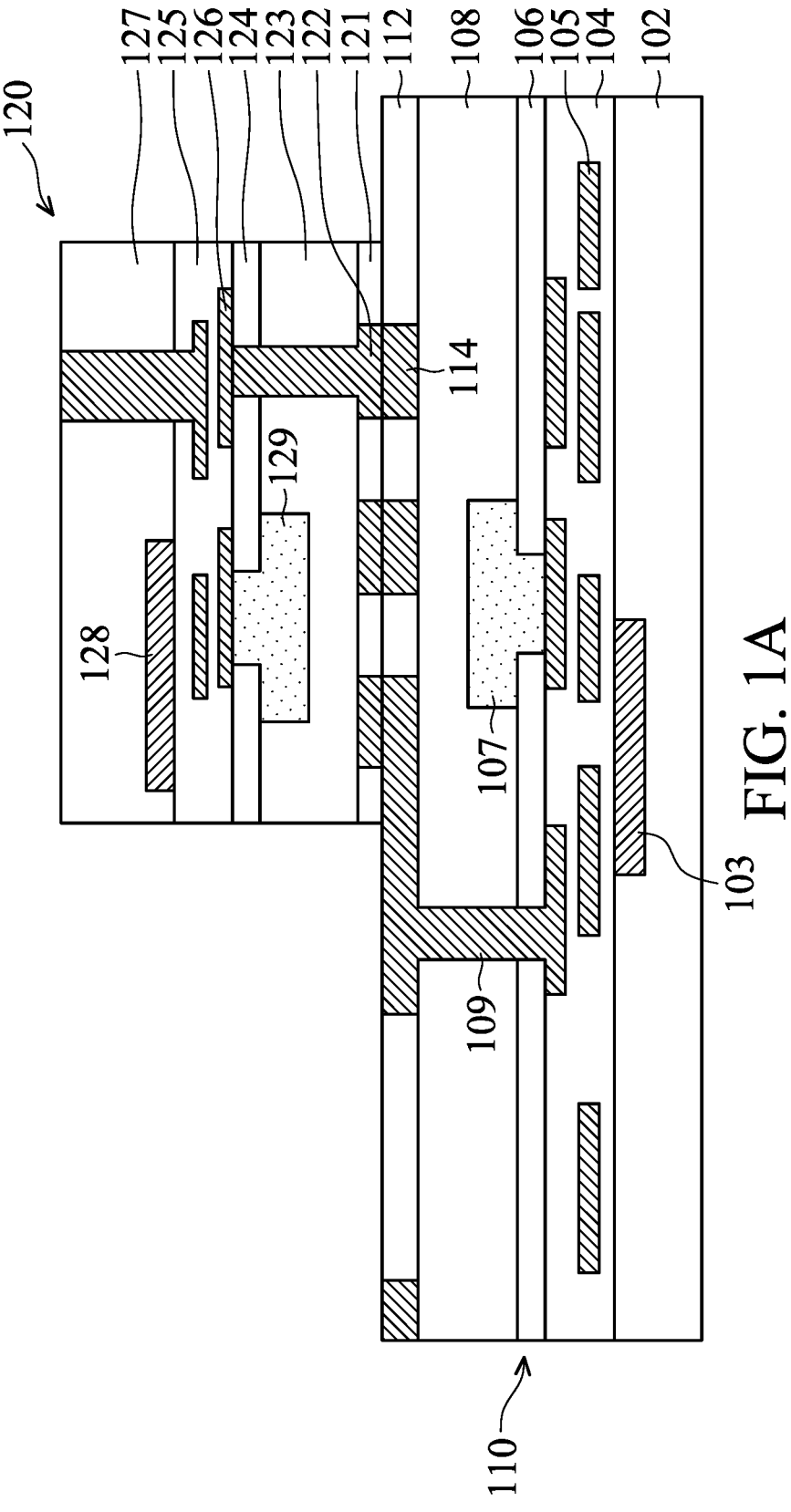
FIG. 1A to FIG. 1J show a process for forming a semiconductor structure in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

A semiconductor device and a method for forming the same are provided in some embodiments of the present disclosure. In some embodiments, the semiconductor structure includes finger-typed capacitors adjacent to a chip to provide shorter interconnect length and time delay between, which will be more suitable for future advanced portable products, such as new-generation smart phones, flat panels, Internet of Things (IoT) devices, or cloud computing devices, etc.

FIG. 1A to FIG. 1J show a process for forming a semiconductor structure 100 in some embodiments of the present disclosure. As shown in FIG. 1A, an interconnect structure 110 is formed on a substrate 102, and then a chip 120 is disposed on the interconnect structure 110, in accordance with some embodiments of the present disclosure.

In some embodiments, the substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond, in accordance with some embodiments. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, the substrate 102 may have a thickness of about 500 μm.

In some embodiments, the chip 120 may be bonded to the interconnect structure 110 by bumpless thermo-compression hybrid bonding process (hot press process). In some embodiments, a pressure is applied to the interconnect structure 110 and the chip 120, and the temperature is raised to about 400° C. for about 2 hours to bond the interconnect structure 110 and the chip 120 together. In some embodiments, the chip 120 may be placed in a desired location above the interconnect structure 110 using, for example, a pick-and-place tool. In some embodiments, the chip 120 is in direct contact with the interconnect structure 110.

In some embodiments, an active device 103 is disposed in the substrate 102. In some embodiments, the active device 103 may be RF dies, baseband dies, logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), sensor dies, micro-electro-mechanical-system (MEMS) dies, signal processing dies (e.g., digital signal processing (DSP) die), front-end dies (e.g., analog front-end (AFE) dies), the like, or a combination thereof.

In some embodiments, the interconnect structure 110 may be used as a redistribution (RDL) structure for routing. In some embodiments, the interconnect structure 110 includes a dielectric layers 104, 106, 108, and 112 disposed on the substrate 102, and conductive structures 105, 107, 109, and 114 disposed in the dielectric layers 104, 106, 108, and 112. In some embodiments, the conductive structures 105, 107, 109, and 114 may include conductive layers, conductive vias, conductive pads, conductive pillars, etc. In some embodiments, the conductive structures 105, 107, 109, and 114 may include a metal or metal alloy such as copper (Cu), cobalt (Co), nickel (Ni), aluminum (Al), or combinations thereof. In the depicted embodiment, the conductive structures 105, 107, 109, and 114 include a metal fill layer formed of copper (Cu) or an aluminum-copper alloy (Al—Cu). In some embodiments, some of the conductive structures 114 are exposed at or protruding from the top surface of the top of the dielectric layer 112. The exposed or protruding conductive structures 114 may serve as bonding pads where conductive bumps (such as tin-containing solder bumps) and/or conductive pillars (such as copper pillars) will be formed later, in accordance with some embodiments.

In some embodiments, the dielectric layer 104 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the dielectric layer 104 are made of or include dielectric materials other than polymer materials. The dielectric material may include silicon oxide, silicon carbide, silicon nitride, silicon oxynitride, one or more other suitable materials, or a combination thereof.

In some embodiments, the dielectric layers 106, 108, and 112 may be referred to as intermetal dielectric (IMD) layers and may include silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In some embodiments, the chip 120 may include dielectric layers 121, 123, 124, and 125, a semiconductor layer 127 disposed on the dielectric layer 125, and conductive structures 122, 126, and 129 disposed in the dielectric layers 121, 123, 124, and 125.

In some embodiments, the dielectric layers 121, 123, and 124 may be referred to as intermetal dielectric (IMD) layers and may include silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In some embodiments, the dielectric layer 125 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the dielectric layer 104 are made of or include dielectric materials other than polymer materials. The dielectric material may include silicon oxide, silicon carbide, silicon nitride, silicon oxynitride, one or more other suitable materials, or a combination thereof. In some embodiments, the conductive structures 122, 126, and 129 may include conductive layers, conductive vias, conductive pads, conductive pillars, etc.

In some embodiments, the semiconductor layer 127 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond, in accordance with some embodiments. Compound semiconductor materials may include, but are not limited to, silicon carbide, gallium arsenic, gallium phosphide, indium phosphide, indium arsenide, and/or indium antimonide, in accordance with some embodiments. Alloy semiconductor materials may include, but are not limited to, SiGe, GaAsP, AlInAs, AlGaAs, GaInAs, GaInP, and/or GaInAsP, in accordance with some embodiments.

In some embodiments, an active device 128 is disposed in the semiconductor layer 127. In some embodiments, the active device 128 may be RF dies, baseband dies, logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), sensor dies, micro-electro-mechanical-system (MEMS) dies, signal processing dies (e.g., digital signal processing (DSP) die), front-end dies (e.g., analog front-end (AFE) dies), the like, or a combination thereof.

Figure 1B:
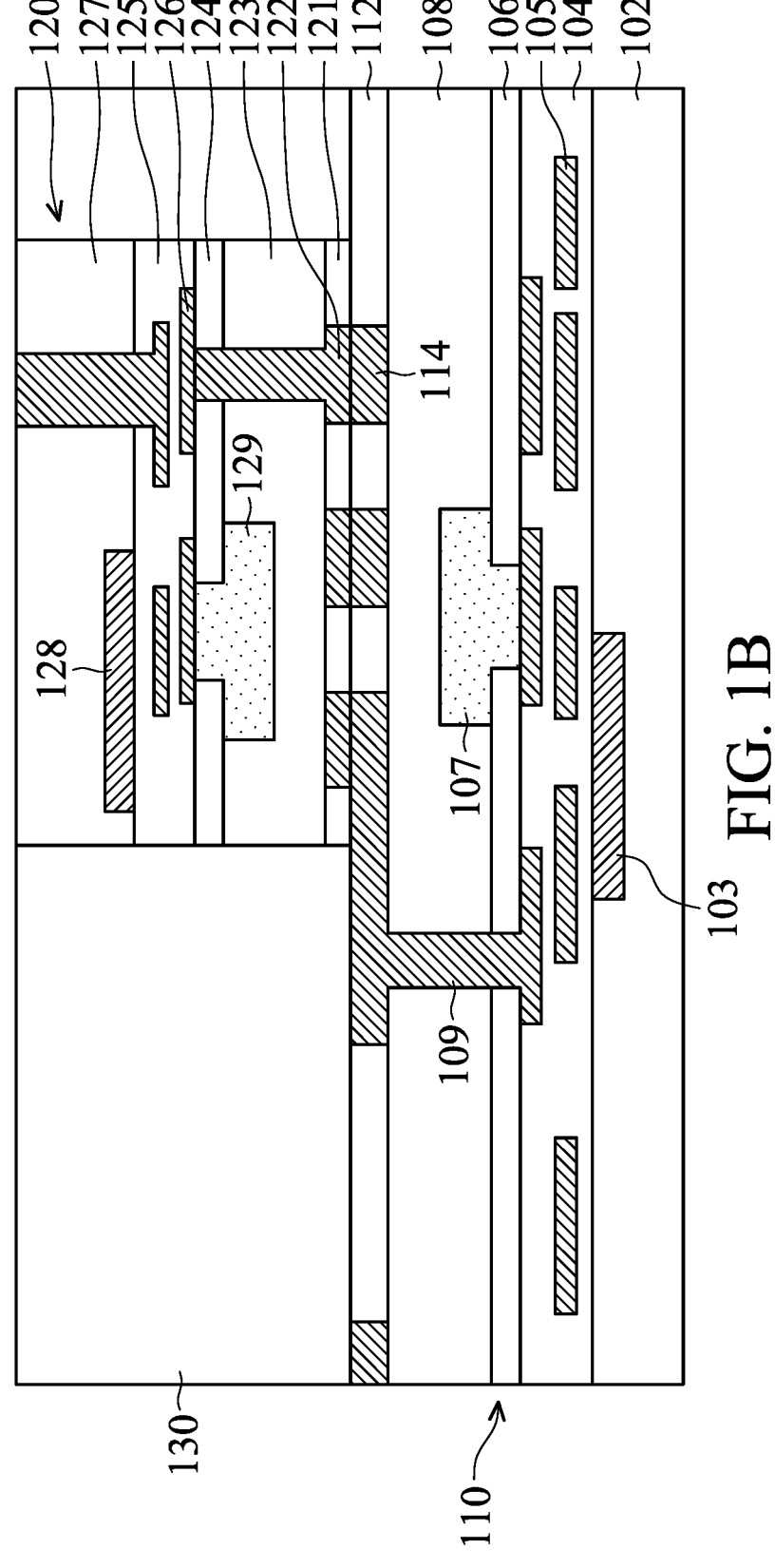

As shown in FIG. 1B, a dielectric layer 130 is disposed on the interconnect structure 110 and surrounding the chip 120 in some embodiments of the present disclosure. Afterwards, a planarization process is performed to expose the top surface of the chip 120 from the dielectric layer 110, in accordance with some embodiments. In some embodiments, the dielectric layer 130 may be referred to as an intermetal dielectric (IMD) layer and may include silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethyl-orthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. In some embodiments, the planarization process may include a grinding process, a chemical mechanical polishing (CMP) process, an etching process, a dry polishing process, one or more other applicable processes, or a combination thereof. In some embodiments, the dielectric layer 130 may have a thickness of about 20 μm.

Figure 1C:
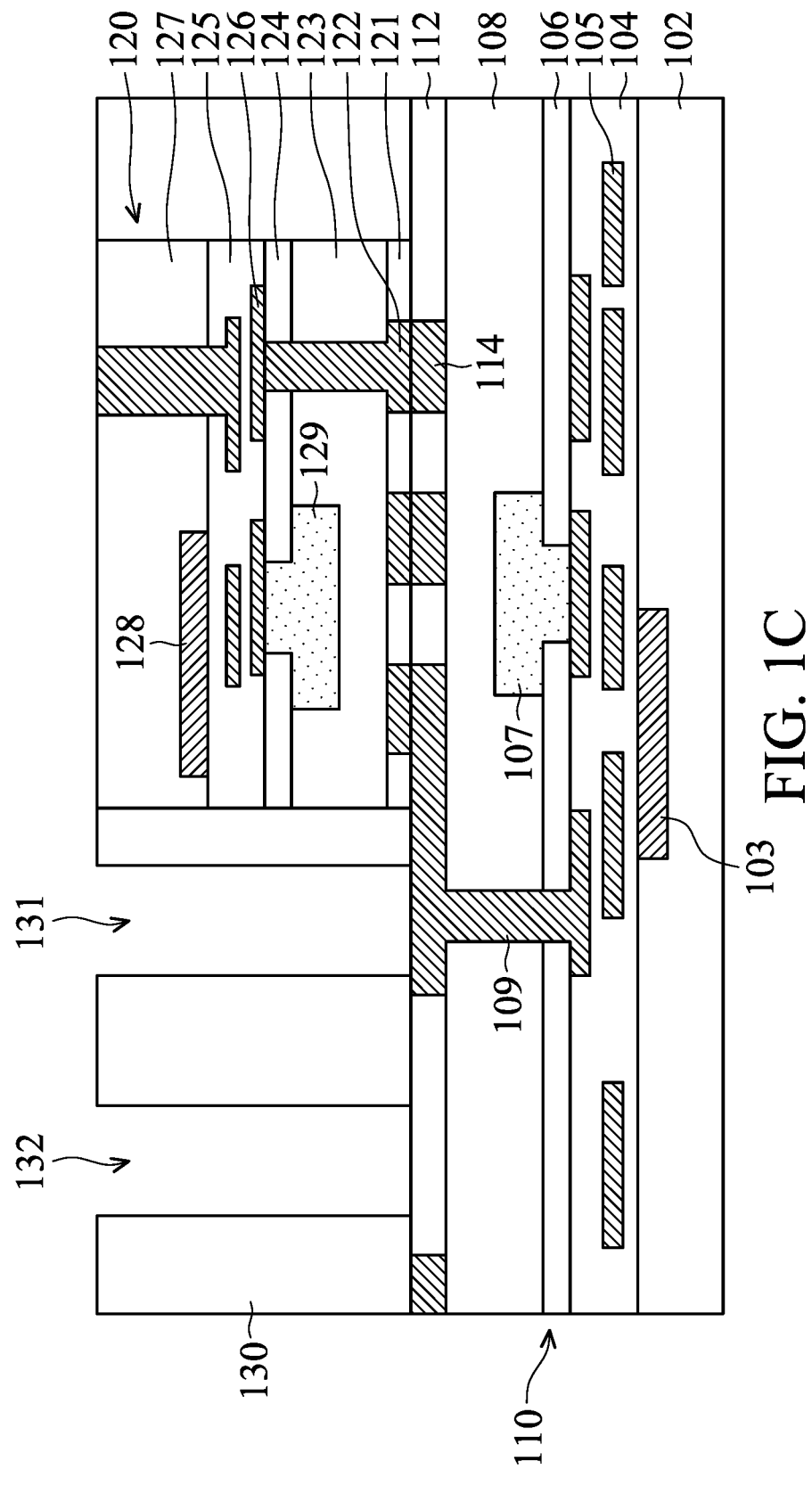

In FIG. 1C, a first opening 131 and a second opening 132 are formed in the dielectric layer 130 in some embodiments. In some embodiments, the first opening 131 and the second opening 132 may be formed by patterning using photolithography to expose the portions of dielectric layer 130 that are to be removed. The exposed portions of dielectric layer 130 may be removed by a dry etching process (e.g. Inductive Coupled Plasma (ICP) etching) to expose the underneath inter connection structure 110, in accordance with some embodiments of the present disclosure.

Figure 1D:
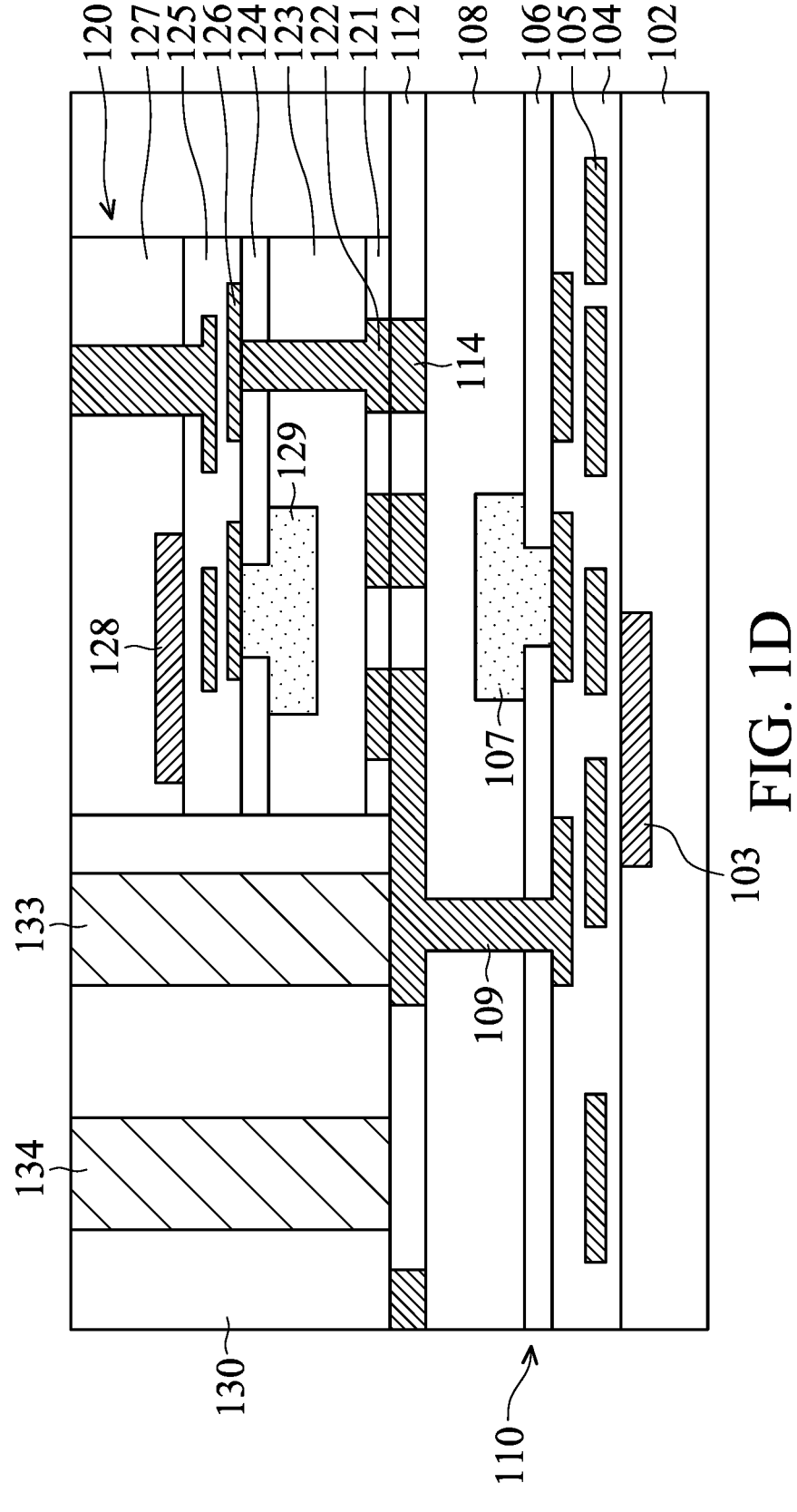

In FIG. 1D, a first via 133 is formed in the first opening 131, and a second via 134 is formed in the second opening 132, in accordance with some embodiments of the present disclosure. In some embodiments, the first via 133 and the second via 134 may be through silicon vias (TSV) and vertically pass through the dielectric layer 130 to provide electrical connection in the vertical direction. In some embodiments, the material of the first via 133 and the second via 134 may include metal, such as Cu, Al, W, or another suitable conductive material. In some embodiments, a seed layer (not shown) is formed in the first opening 131 and the second opening 132 before forming the first via 133 and the second via 134. In some embodiments, the seed layer may include titanium (Ti), cobalt (Co), or copper (Cu). Afterwards, a chemical mechanical polishing (CMP) process is then performed to remove excess materials overfilling the first opening 131 and the second opening 132, in accordance with some embodiments of the present disclosure.

Figure 1E:
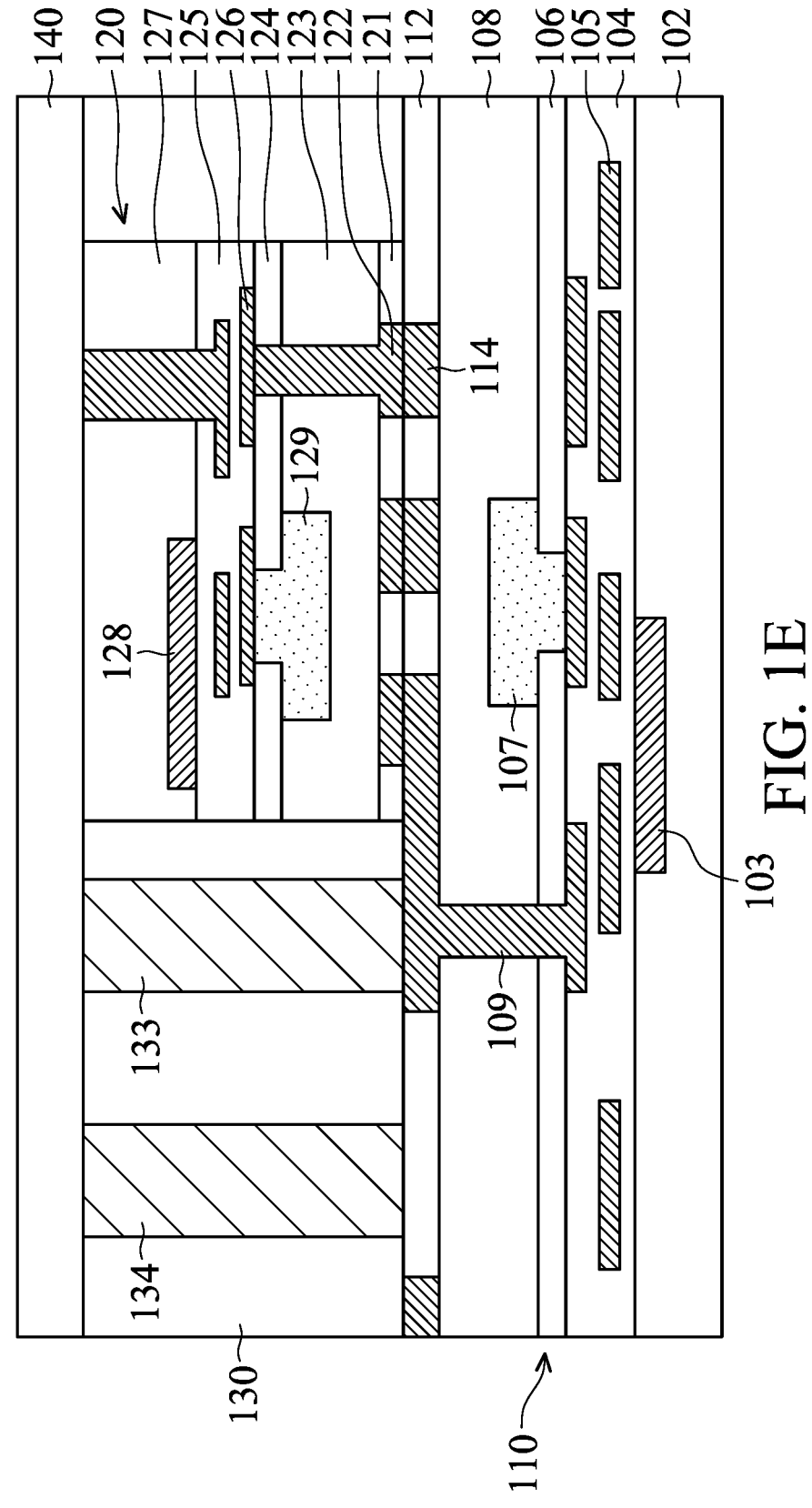

In some embodiments, as shown in FIG. 1E, a dielectric layer 140 is disposed on the dielectric layer 130 to cover the chip 120, the first via 133, and the second via 134. In some embodiments, the dielectric layer 140 may be referred to as an intermetal dielectric (IMD) layer and may include silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. In some embodiments, the dielectric layer 140 may have a thickness of about 2 μm.

Figure 1F:
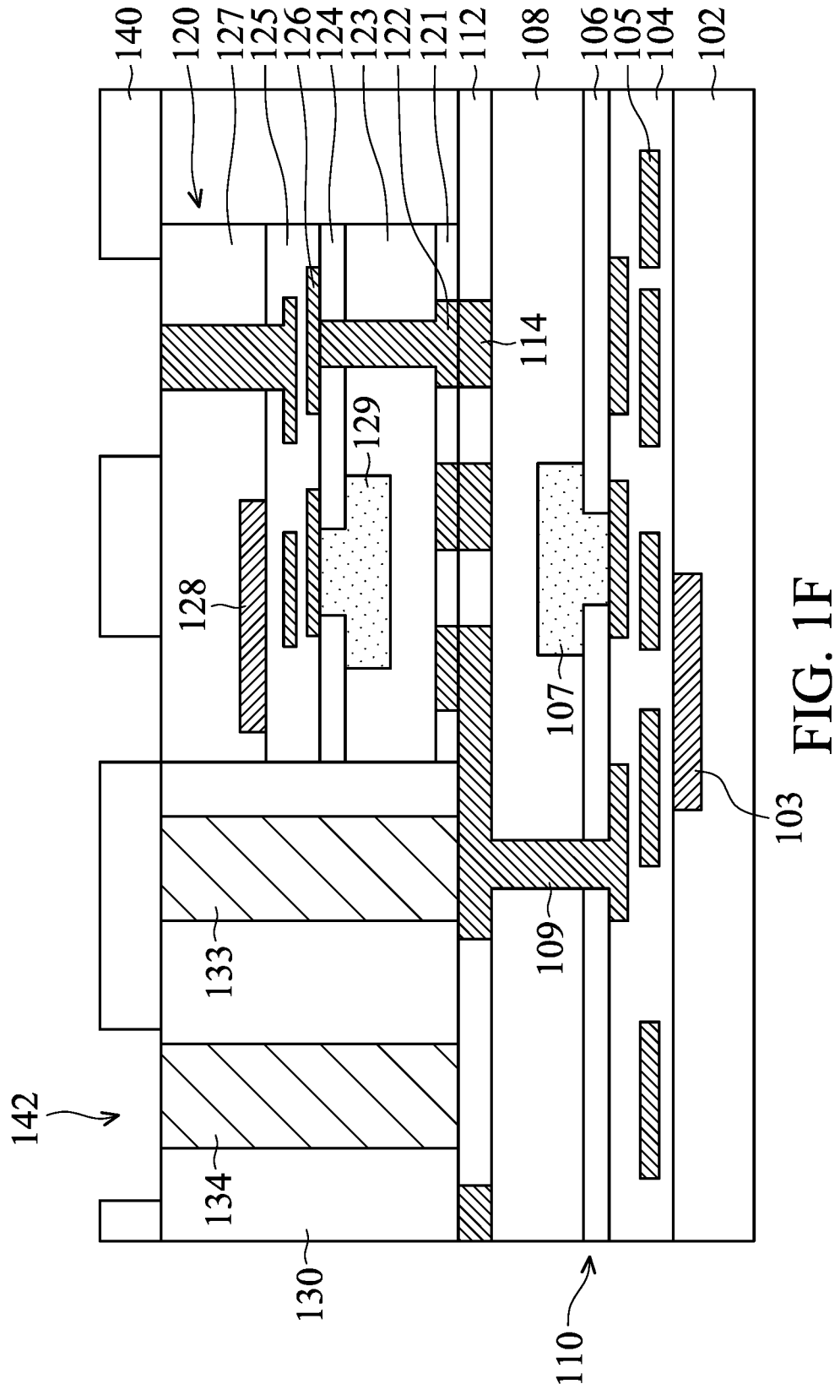

In FIG. 1F, openings 142 are formed in the dielectric layer 140 to expose the structure underneath. For example, in some embodiments, the second via 134 is exposed from the openings 142. Meanwhile, the first via 133 is covered by the dielectric layer 140. In some embodiments, the openings 142 may be formed by patterning using photolithography to expose the portions of dielectric layer 140 that are to be removed. In some embodiments, the exposed portions of dielectric layer 140 may be removed by suitable etching processes.

Figure 1G:
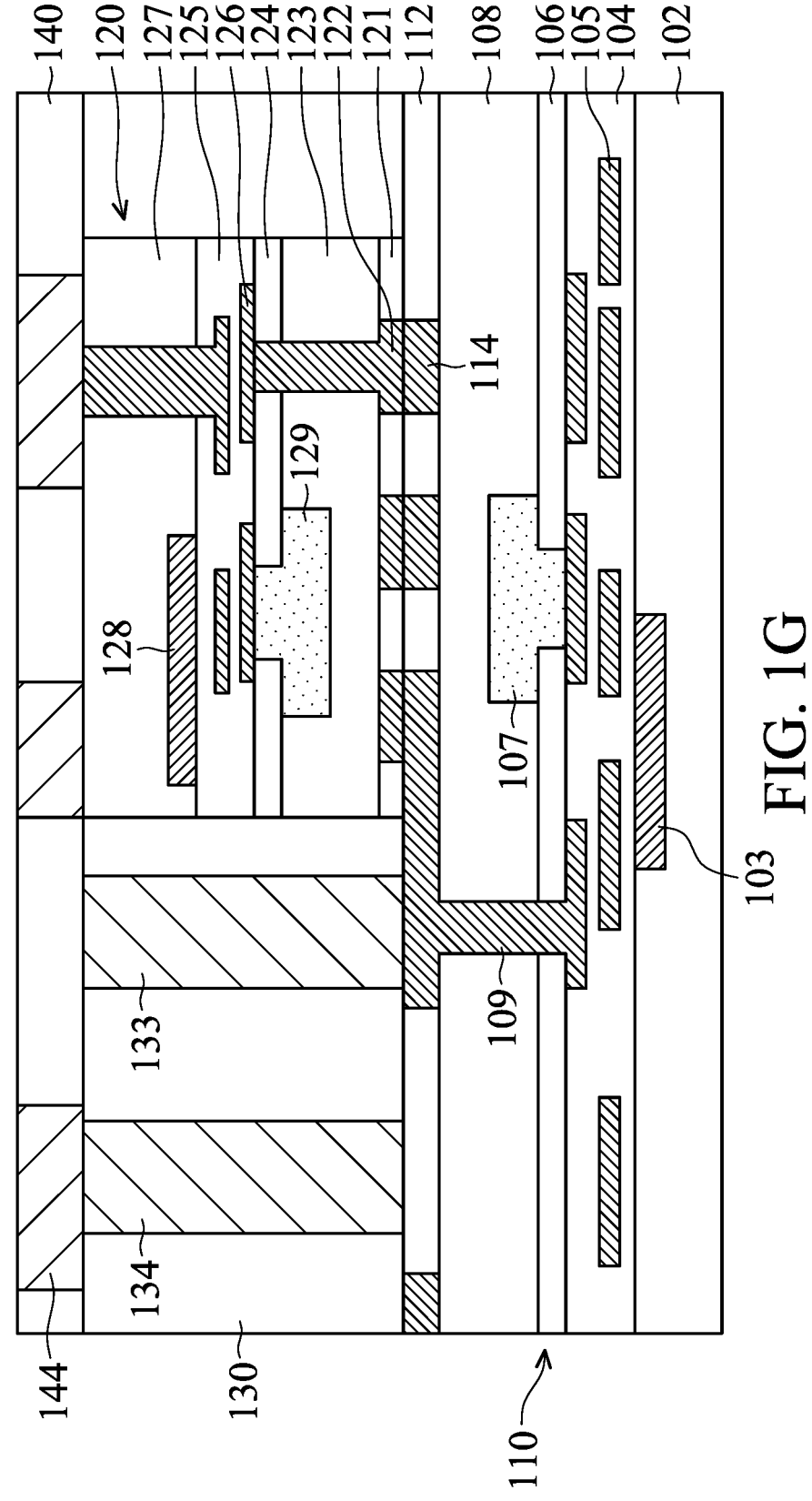

In FIG. 1G, a conductive layer 144 is formed in the openings 142, in accordance with some embodiments of the present disclosure. In some embodiments, the material of the conductive layer 144 may include metal, such as Cu, Al, W, or another suitable conductive material. In some embodiments, a seed layer (not shown) is formed in the openings 142 before forming the conductive layer 144. In some embodiments, the seed layer may include titanium (Ti), cobalt (Co), or copper (Cu). Afterwards, a chemical mechanical polishing (CMP) process is then performed to remove excess materials overfilling the openings 142, in accordance with some embodiments. In some embodiments, the dielectric layer 112 is spaced apart from the first via 133, and the dielectric layer 140 is spaced apart from the second via 134.

Figure 1H:
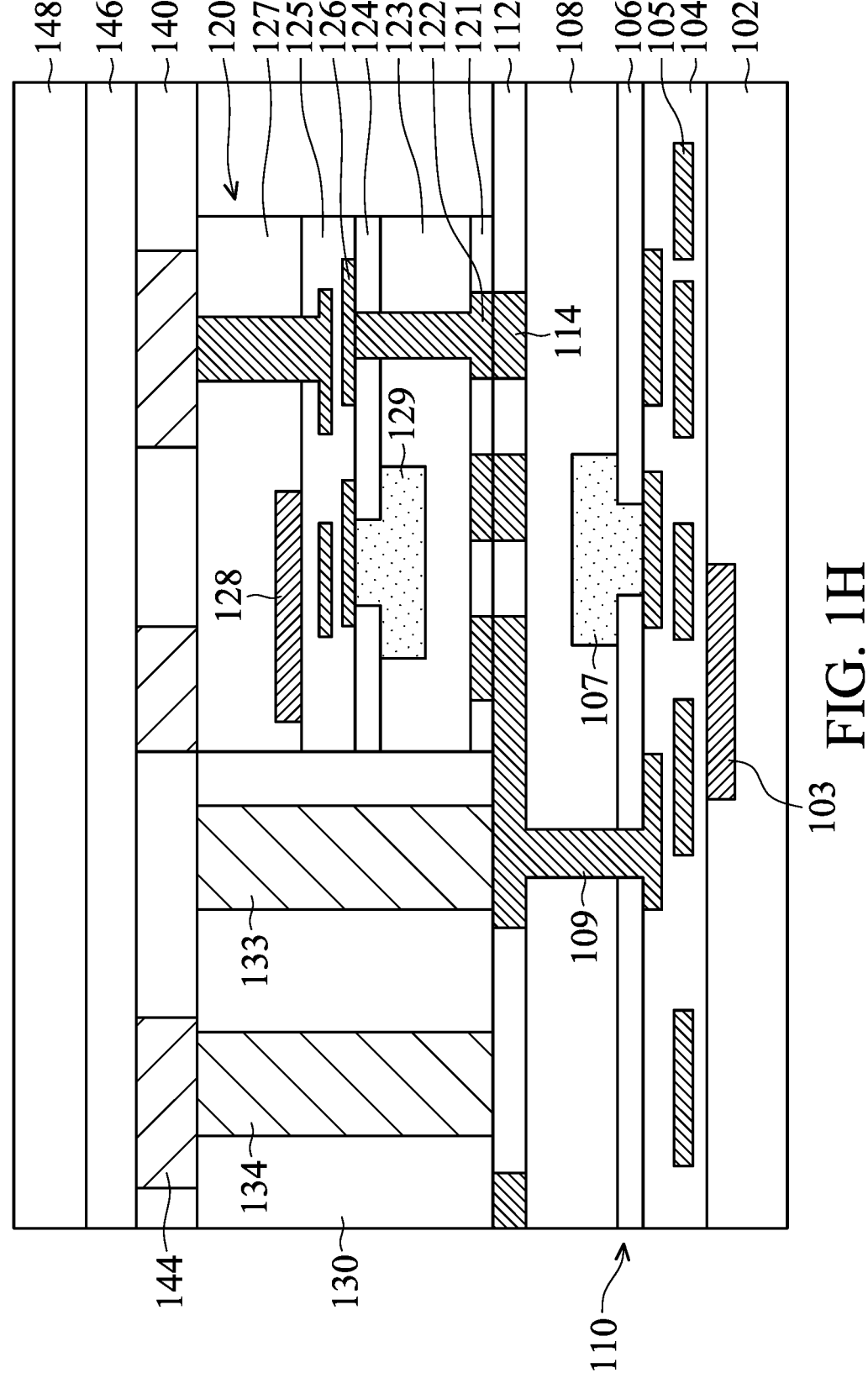

As shown in FIG. 1H, a dielectric layer 146 is disposed on the dielectric layer 140 and the conductive layer 144, and then a protective layer 148 is disposed on the dielectric layer 146, in accordance with some embodiments of the present disclosure. In some embodiments, the dielectric layer 146 may include nitride material, which may include silicon nitride (SiN$_x$), silicon oxy-nitride (SiON$_x$), combinations or multiple layers thereof, or the like. In some embodiments, the protective layer 148 may include polyimide, polybenzoxazole (PBO), benzocyclobutene (BCB), other suitable polymeric materials, or combinations thereof. In some embodiments, the dielectric layer 146 may have a thickness of about 600 nm. In some embodiments, the protective layer 148 may have a thickness between about 2.5 μm and about 5 μm.

Figure 1I:
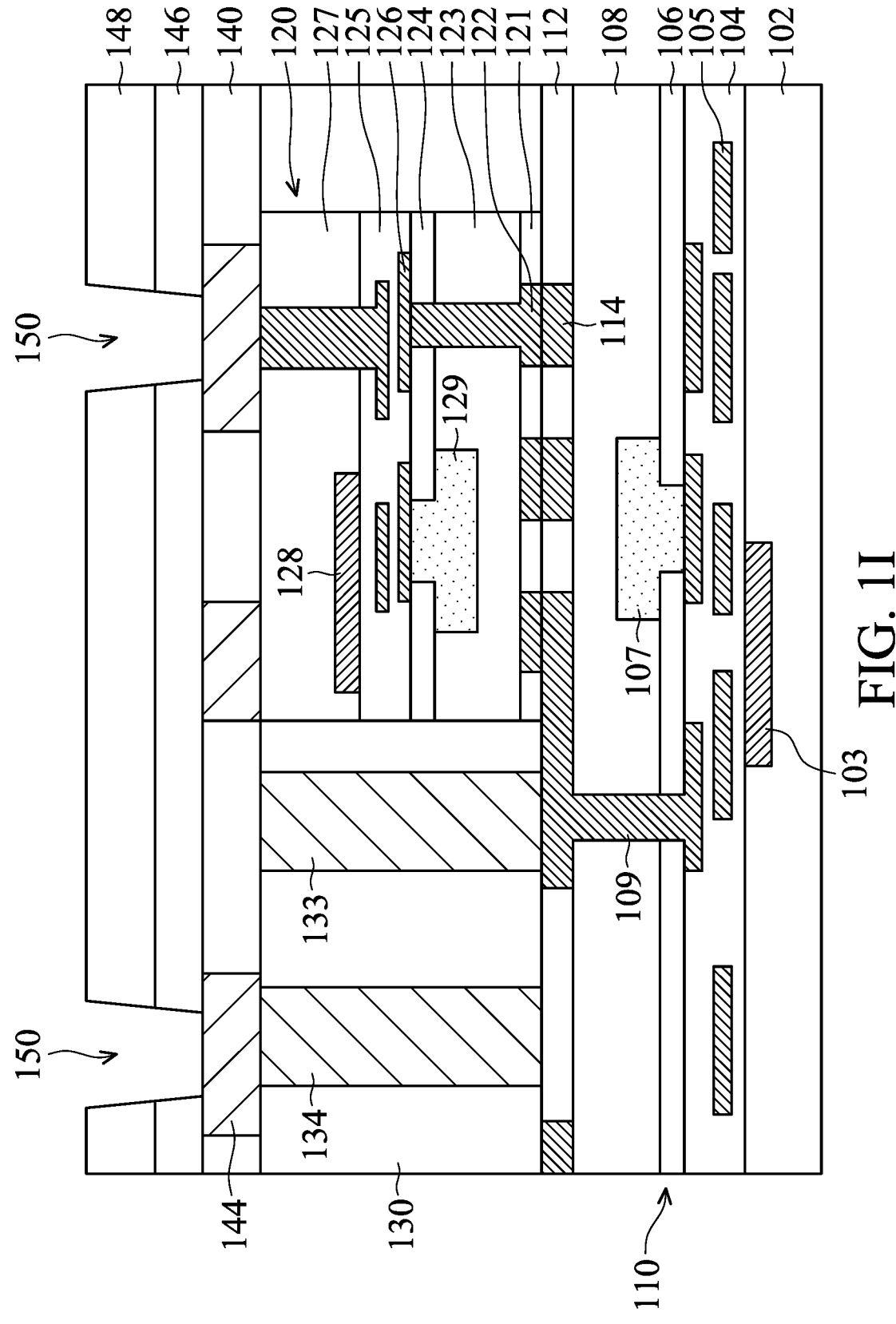

In FIG. 1I, openings 150 are formed in the dielectric layer 146 and the protective layer 148 to expose the conductive layer 144, in accordance with some embodiments of the present disclosure. In some embodiments, the openings 150 may be formed by patterning using photolithography to expose the portions of the dielectric layer 146 and the protective layer 148 that are to be removed. In some embodiments, the exposed portions of the dielectric layer 146 and the protective layer 148 may be removed by suitable etching processes.

Figure 1J:
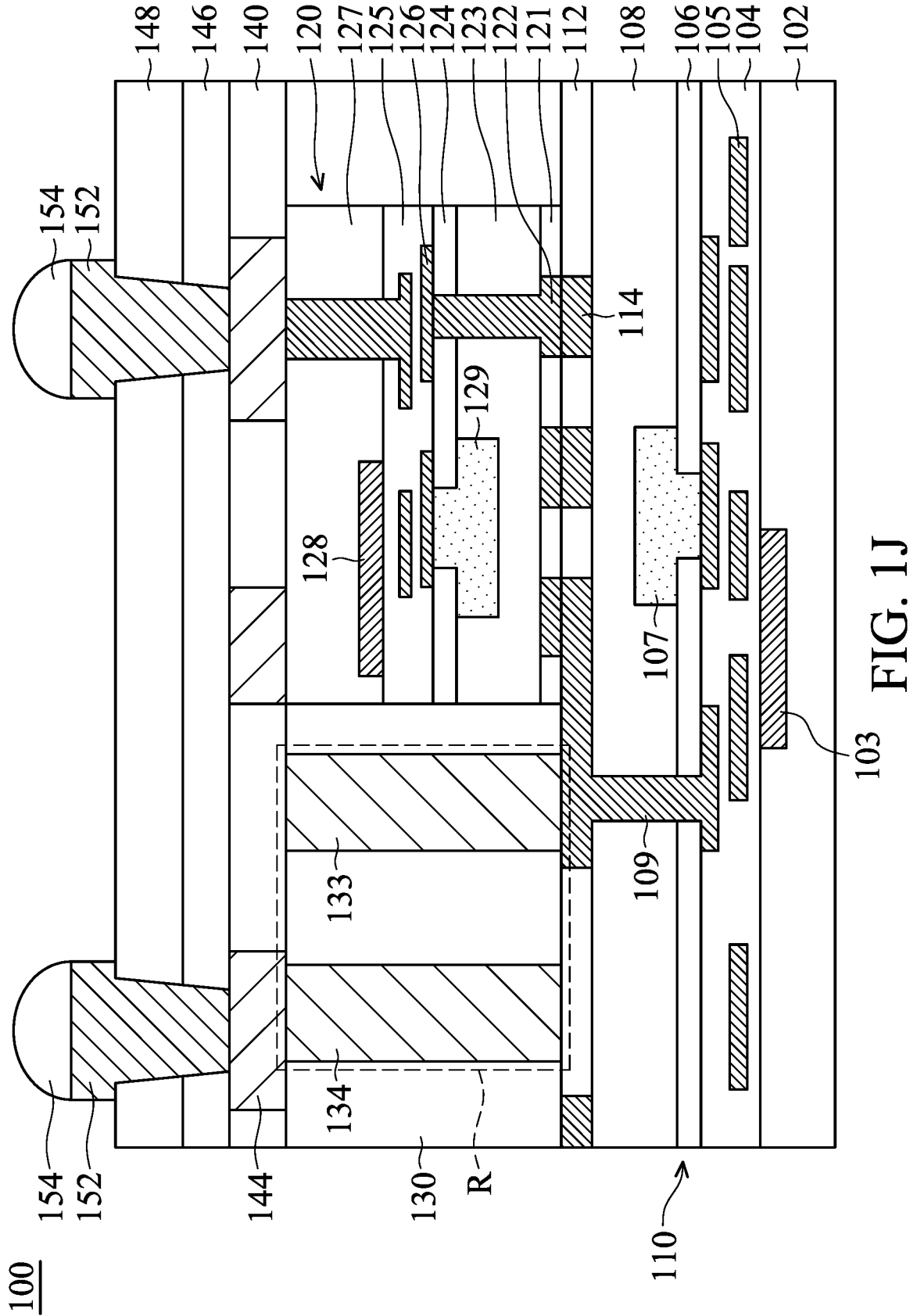

In FIG. 1J, conductive structures 152 are formed in the openings 150, and then conductive bumps 154 are formed on the conductive structures 152 to form the semiconductor structure 100, in accordance with some embodiments. In some embodiments, some of the conductive structures 152 are exposed at or protruding from the top surface of the top of the protective layer 148. The exposed or protruding conductive structures 152 may serve as vias and bonding pads, where the conductive bumps 154 will be formed later. In some embodiments, the conductive bumps 154 are made of a solder material, such as Sn and Ag or another suitable conductive material (e.g., gold). In some embodiments, the conductive bumps 154 may be micro bumps, electroless nickel-electroless palladium-immersion gold technique (ENEPIG) formed bumps, ball grid array (BGA) bumps, or the like.

Figure 2:
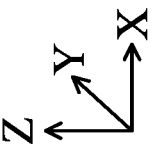
FIG. 2 is a schematic view showing a region R in FIG. 1J, in accordance with some embodiments of the present disclosure.

FIG. 2 is a schematic view showing a region R in FIG. 1J, in accordance with some embodiments of the present disclosure. As shown in FIG. 2, the first vias 133 and the second vias 134 may arrange as an array, in accordance with some embodiments. For example, in some embodiments, the first vias 133 may arrange in the Y direction as first via columns, the second vias 134 may arrange in the Y direction as second via columns, and the first via columns and the second via columns may arrange in sequence in the X direction. In some embodiments, the conductive structure 114 is in contact with the first vias 133 and separated from the second vias 134, and the conductive layer 144 is separated from the first vias 133 and in contact with the second vias 134. For example, in some embodiments openings may be formed in the conductive structure 114, and the openings in the conductive structure 114 and the second vias 134 may be overlap with each other. On the other hand, openings may be formed in the conductive layer 144, and the openings in the conductive layer 144 and the first vias 133 may be overlap with each other, in accordance with some embodiments. Therefore, the conductive structure 114 and the conductive layer 144 are electrically insulated from each other, and the first vias 133 and the second vias 134 are also electrically insulated from each other, in accordance with some embodiments.

In some embodiments, the first vias 133 and the second vias 134 are rectangular columns. In some embodiments, each of the first vias 133 or the second vias 134 has a height between about 20 μm and about 750 μm. In some embodiments, each of the first vias 133 or the second vias 134 has a width between about 5 μm and about 20 μm. In some embodiments, the ratio of height to width of each of the first vias 133 or the second vias 134 is between about 4 and about 250. Therefore, the first vias 133 and the second vias 134 have high aspect ratios to increase the capacitance.

In some embodiments, a first voltage may be applied to the conductive layer 144, and a second voltage (e.g. ground voltage) different from the first voltage may be applied to the conductive structure 114. Therefore, the structure shown in FIG. 2 may serve as a capacitor to stabilize the signal provided to the chip 120, in accordance with some embodiments. In some embodiments, the capacitor may have a capacitance between about 100 fF and about 800 nF.

Figure 3A:
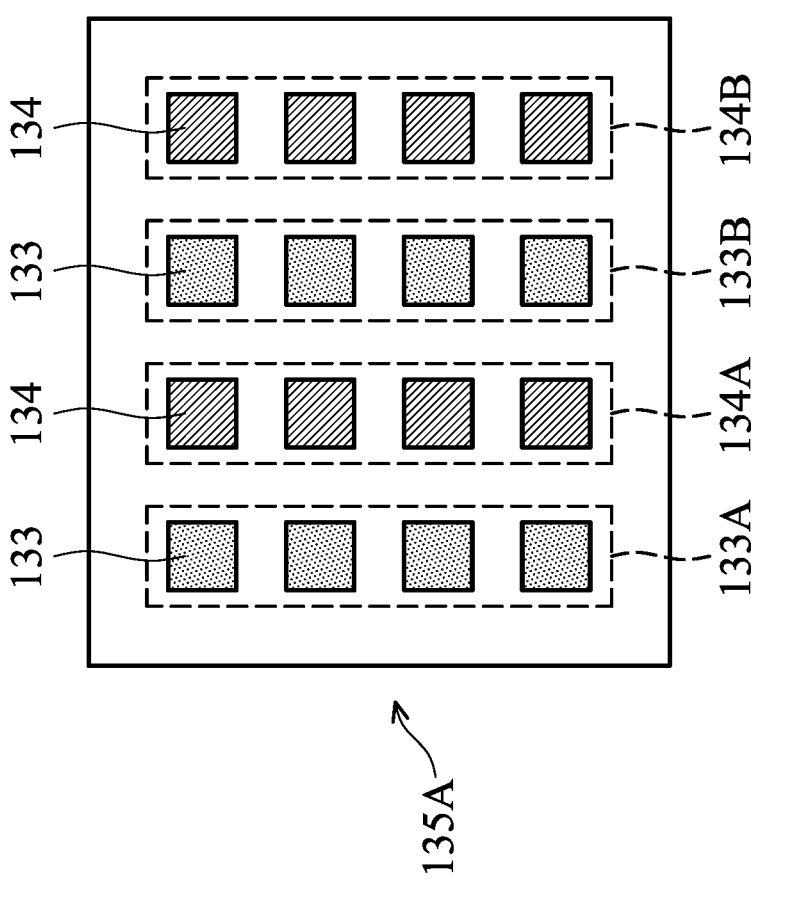
FIG. 3A to FIG. 3E are top views showing the arrangement of the first vias and the second vias, in accordance with some embodiments.

FIG. 3A to FIG. 3E are top views showing the arrangement of the first vias 133 and the second vias 134, in accordance with some embodiments. In some embodiments, vias (the first vias 133 or the second vias 134) arrange in the Y direction may be referred to as a via column. FIG. 3A shows a via array 135A including via columns 133A, 134A, 133B, 134B sequentially arrange in X direction, in accordance with some embodiments. In some embodiments, the distances between the via columns 133A, 134A, 133B, 134B in the X direction may be substantially identical. In some embodiments, the via columns 133A and 133B includes at least one first via 133, and the via columns 134A and 134B includes at least one second via 134. In some embodiments, the first vias 133 and the second vias 134 are arranged in a staggered fashion in the X direction.

Figure 3B:
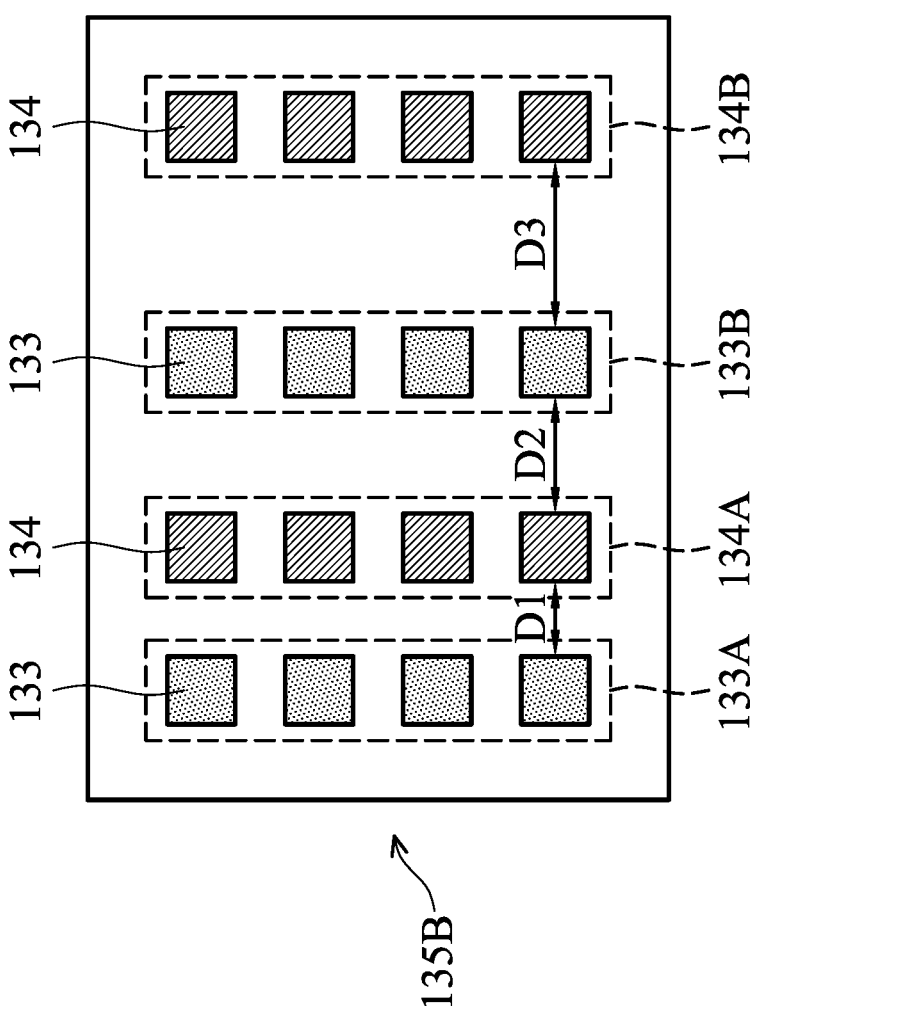

FIG. 3B shows a via array 135B including via columns 133A, 134A, 133B, 134B sequentially arrange in X direction, in accordance with some embodiments. In some embodiments, the distances between the via columns 133A, 134A, 133B, 134B in the X direction may be different. In some embodiments, a distance D1 between the via columns 133A and 134A, a distance D2 between the via columns 134A and 133B, and a distance D3 between the via columns 133B and 134B are different. In some embodiments, the distance D1 is shorter than the distance D2. In some embodiments, the distance D2 is shorter than the distance D3. For example, the distance D1 between the via columns 133A and 134A is between about 0.01 and about 1 μm, in accordance with some embodiments of the present disclosure. In some embodiments, the distance D2 between the via columns 134A and 133B is between about 1 and about 100 μm. In some embodiments, the distance D3 between the via columns 133B and 134B is between about 100 and about 1000 μm.

Since the distance between the via columns may be different, various capacitances with high bandwidth may be provided by the configuration of the via array 135B, in accordance with some embodiments. For example, A capacitance provided by the via columns 133A and 134A is in micron-Farad (μF) region, which can be used for inductor and Power Management IC (PMIC). A capacitance provided by the via columns 134A and 133B is in nano-Farad (nF) region, which can be used for voltage regulator and decupling capacitors (DeCAP), in accordance with some embodiments. A capacitance provided by the via columns 133B and 134B is in pica-Farad (pF) region, which can be used for RF matching, in accordance with some embodiments. Therefore, various ranges of capacitance may be provided by the via array 135B, which means a broad spectrum of capacitances for all kinds of decupling capacitors and power managements is provided in some embodiments.

Figure 3C:
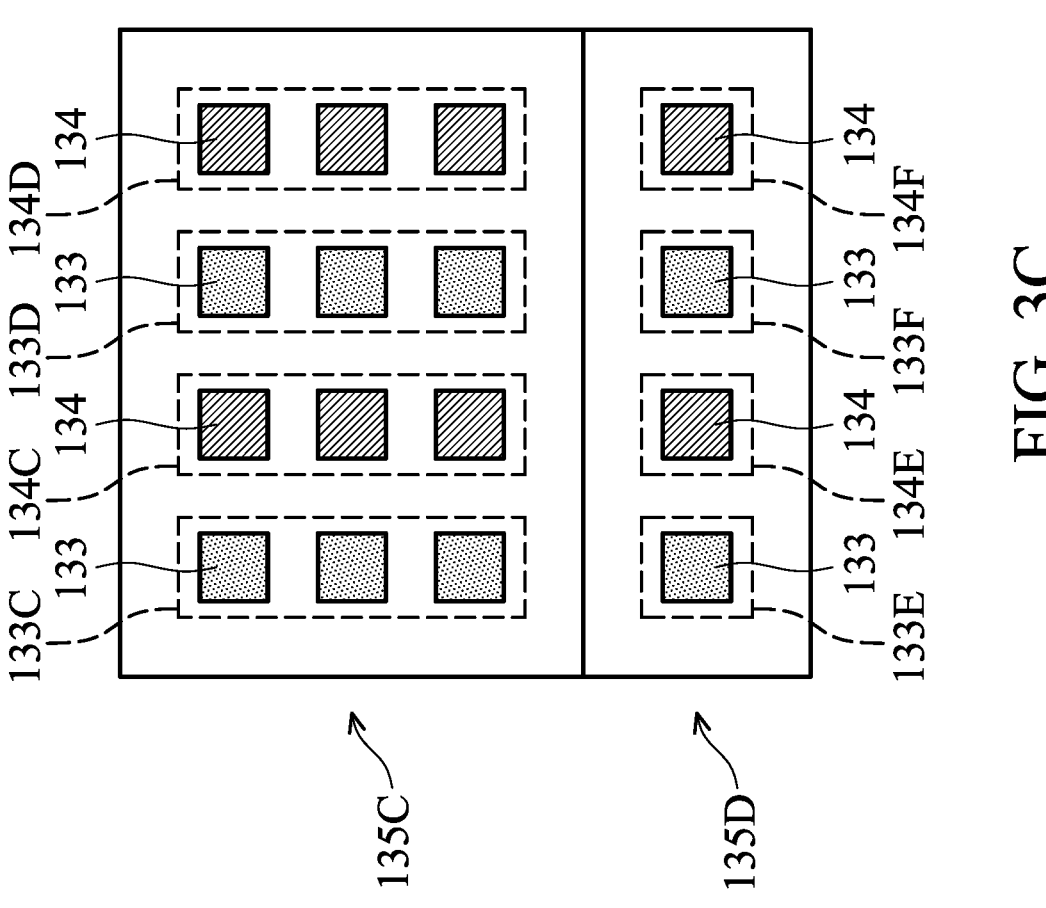

FIG. 3C shows a via array 135C including via columns 133C, 134C, 133D, and 134D sequentially arrange in X direction, and a via array 135D including via columns 133E, 134E, 133F, and 134F sequentially arrange in X direction, in accordance with some embodiments. In some embodiments, the via columns 133C, 133D, 133E, and 133F includes at least one first via 133, and the via columns 134C, 134D, 134E, and 134F includes at least one second via 134. In some embodiments, the first vias 133 and the second vias 134 are arranged in a staggered fashion in the X direction. In some embodiments, the via columns 133C and 133E may arrange in the Y direction, the via columns 134C and 134E may arrange in the Y direction, the via columns 133D and 133F may arrange in the Y direction, and the via columns 134D and 134F may arrange in the Y direction. In some embodiments, the distance between the via columns 133C, 134C, 133D, and 134D may be substantially identical in the X direction. In some embodiments, the distance between the via columns 133E, 134E, 133F, and 134F may be substantially identical in the X direction.

In some embodiments, the via arrays 135C and 135D may be electrically insulated from each other. For example, in some embodiments, the conductive structure 114 may be separated as two portions insulated from each other and electrically connected to the first vias 133 in the via arrays 135C and 135D, respectively. Furthermore, the conductive layer 144 may be separated as two portions insulated from each other and electrically connected to the second vias 134 in the via arrays 135C and 135D, respectively. In some embodiments, there may be a different number of vias in the columns of the via arrays 135C and 135D. For example, via column 133C has three vias, and via column 133E has one via, in accordance with some embodiments. Therefore, the via arrays 135C and 135D may serve as capacitors with different capacitance, which may be applicable for different usages.

Figure 3D:
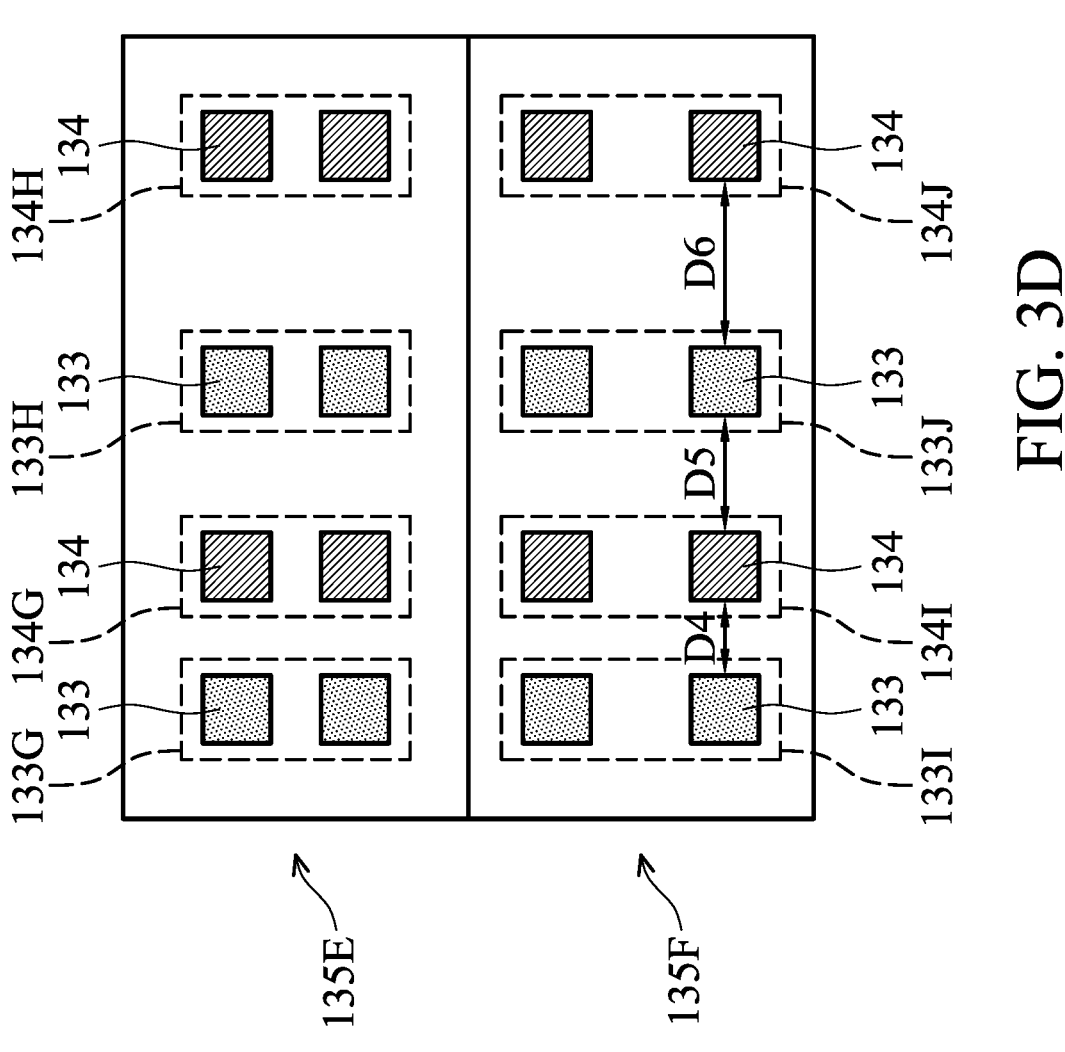

FIG. 3D shows a via array 135E including via columns 133G, 134G, 133H, and 134H sequentially arrange in X direction, and a via array 135F including via columns 133I, 134I, 133J, and 134J sequentially arrange in X direction, in accordance with some embodiments. In some embodiments, the via columns 133G, 133H, 133I, and 133J includes at least one first via 133, and the via columns 134G, 134H, 134I, and 134J includes at least one second via 134. In some embodiments, the via arrays 135E and 135F may arrange in the Y direction. In some embodiments, the via columns 133G and 133I may arrange in the Y direction, the via columns 134G and 134I may arrange in the Y direction, the via columns 133G and 133I may arrange in the Y direction, and the via columns 134G and 134I may arrange in the Y direction.

In some embodiments, the distance between the via columns 133G, 134G, 133H, and 134H may be different in the X direction. In some embodiments, the distance between the via columns 133I, 134I, 133J, and 134J may be different in the X direction. For example, a distance D4 is between the columns 133G and 134G (or between the columns 133I and 134I) in the X direction, a distance D5 is between the columns 134G and 133H (or between the columns 134I and 133J) in the X direction, a distance D6 is between the columns 133H and 134H (or between the columns 133J and 134J) in the X direction, and the distances D4, D5, and D6 are different, in accordance with some embodiments. In some embodiments, the distance D4 is shorter than the distance D5. In some embodiments, the distance D5 is shorter than the distance D6. In some embodiments, the distance D4 is shorter than the distance D6. For example, the distance D4 is between about 0.01 and about 1·m, in accordance with some embodiments of the present disclosure. In some embodiments, the distance D5 is between about 1 and about 100·m. In some embodiments, the distance D6 is between about 100 and about 1,000·m. In some embodiments, the via arrays 135E and 135F may be electrically insulated from each other. In some embodiments, there may be an identical number of vias in the columns of the via arrays 135E and 135F.

Since the distance between the via columns may be different, various capacitances with high bandwidth may be provided by the configuration of the via arrays 135E and 135F, in accordance with some embodiments. Therefore, various ranges of capacitance may be provided by the via arrays 135E and 135F, which means a broad spectrum of capacitances for all kinds of decupling capacitors and power managements is provided in some embodiments.

Figure 3E:
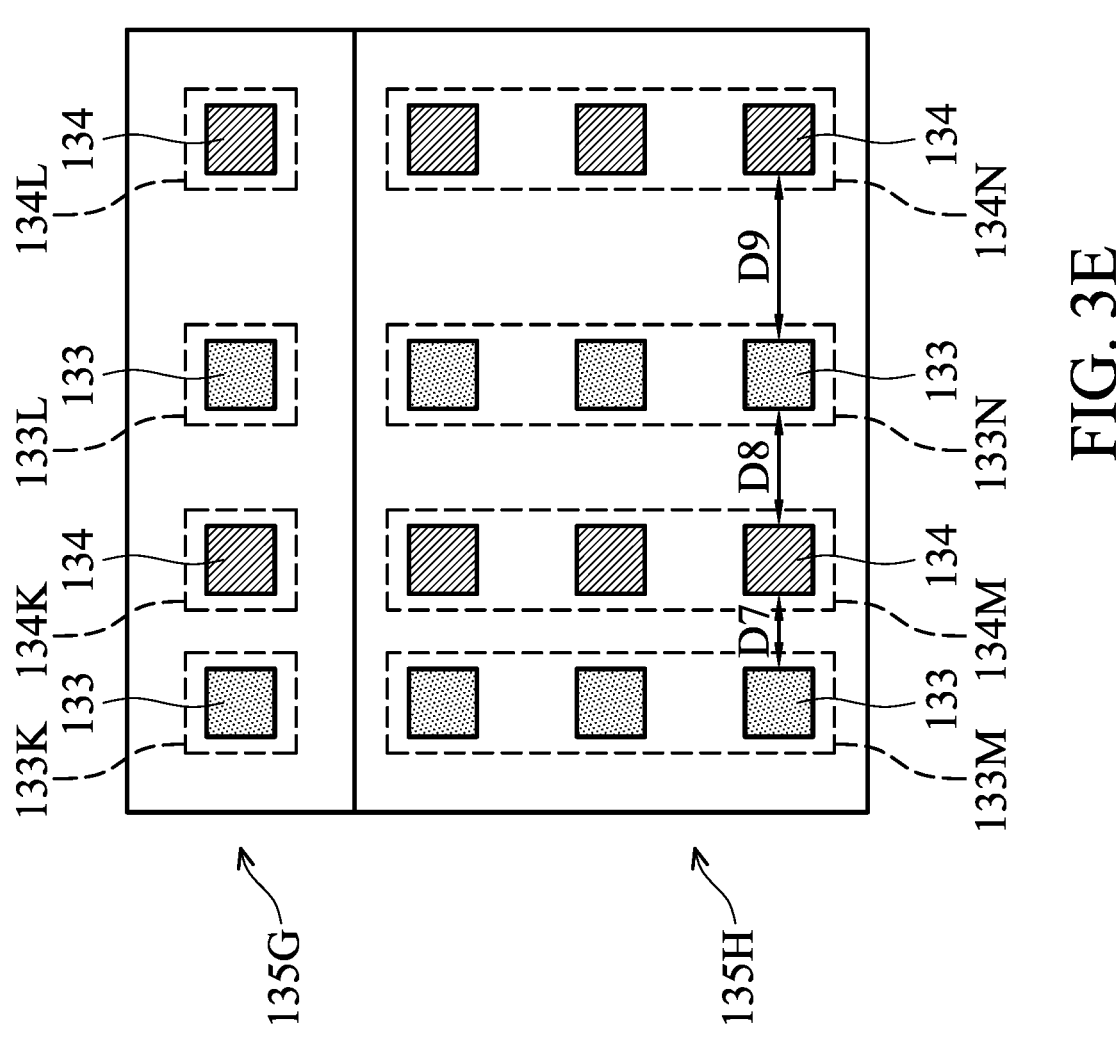

FIG. 3E shows a via array 135G including via columns 133K, 134K, 133L, and 134L sequentially arrange in X direction, and a via array 135H including via columns 133M, 134M, 133N, and 134N sequentially arrange in X direction, in accordance with some embodiments. In some embodiments, the via columns 133K, 133L, 133M, and 133N includes at least one first via 133, and the via columns 134K, 134L, 134M, and 134N includes at least one second via 134. In some embodiments, the via arrays 135G and 135H may arrange in the Y direction. In some embodiments, the via columns 133K and 133M may arrange in the Y direction, the via columns 134K and 134M may arrange in the Y direction, the via columns 133L and 133N may arrange in the Y direction, and the via columns 134L and 134N may arrange in the Y direction.

In some embodiments, the distance between the via columns 133K, 134K, 133L, and 134L may be different in the X direction. In some embodiments, the distance between the via columns 133M, 134M, 133N, and 134N may be different in the X direction. For example, a distance D7 is between the columns 133K and 134K (or between the columns 133M and 134M) in the X direction, a distance D8 is between the columns 134K and 133L (or between the columns 134M and 133N) in the X direction, a distance D9 is between the columns 133L and 134L (or between the columns 133N and 134N) in the X direction, and the distances D7, D8, and D9 are different, in accordance with some embodiments. In some embodiments, the distance D7 is shorter than the distance D8. In some embodiments, the distance D8 is shorter than the distance D9. For example, the distance D7 is between about 0.01 and about 1·m, in accordance with some embodiments of the present disclosure. In some embodiments, the distance D8 is between about 1 and about 100·m. In some embodiments, the distance D9 is between about 100 and about 1,000·m. In some embodiments, the via arrays 135G and 135H may be electrically insulated from each other. In some embodiments, there may be a different number of vias in the columns of the via arrays 135G and 135H for different usages.

Since the distance between the via columns may be different, various capacitances with high bandwidth may be provided by the configuration of the via arrays 135G and 135H, in accordance with some embodiments. Therefore, various ranges of capacitance may be provided by the via arrays 135G and 135H, which means a broad spectrum of capacitances for all kinds of decupling capacitors and power managements is provided in some embodiments.

Figure 4A:
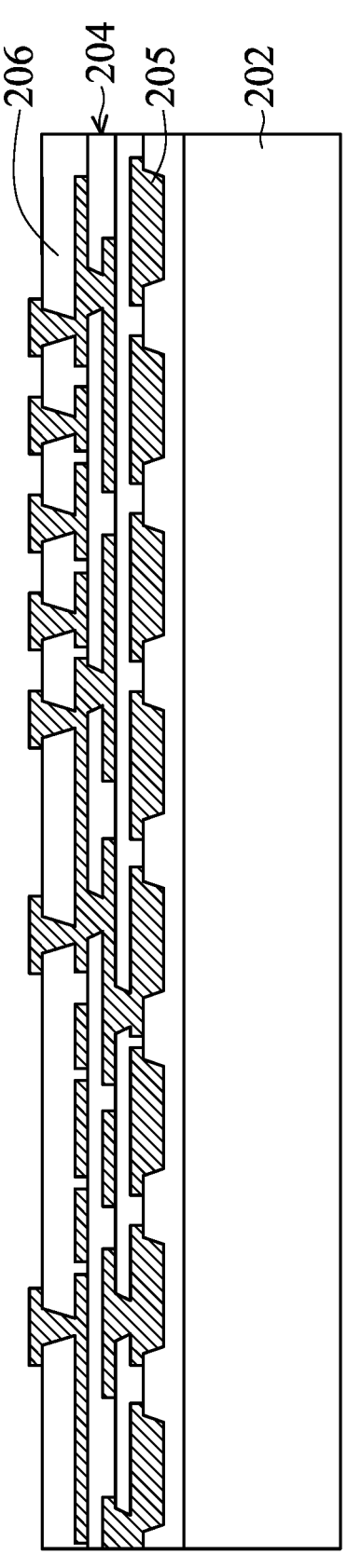
FIG. 4A to FIG. 4E show cross-sectional views of various stages of forming a package structure having the semiconductor structure described in FIG. 1A to FIG. 1J, in accordance with some embodiments of the disclosure.

FIG. 4A to FIG. 4E show cross-sectional views of various stages of forming a package structure 200 having the semiconductor structure 100 described FIG. 1A to FIG. 1J, in accordance with some embodiments of the disclosure. Referring to FIG. 4A, a carrier substrate 202 is provided. The carrier substrate 202 is configured to provide temporary mechanical and structural support during subsequent processing steps, in accordance with some embodiments. The carrier substrate 202 includes glass, silicon oxide, aluminum oxide, metal, a combination thereof, and/or the like, in accordance with some embodiments. The carrier substrate 202 includes a metal frame, in accordance with some embodiments.

An interconnect structure 204 is formed over the carrier substrate 202. The interconnect structure 204 may be used as a redistribution (RDL) structure for routing. The interconnect structure 204 includes multiple dielectric layers 205 and multiple conductive layers 206, in accordance with some embodiments. In some embodiments, some of the conductive layers 205 are exposed at or protruding from the top surface of the top of the dielectric layers 206. The exposed or protruding conductive layers 205 may serve as bonding pads where conductive bumps (such as tin-containing solder bumps) and/or conductive pillars (such as copper pillars) will be formed later, in accordance with some embodiments.

Figure 4B:
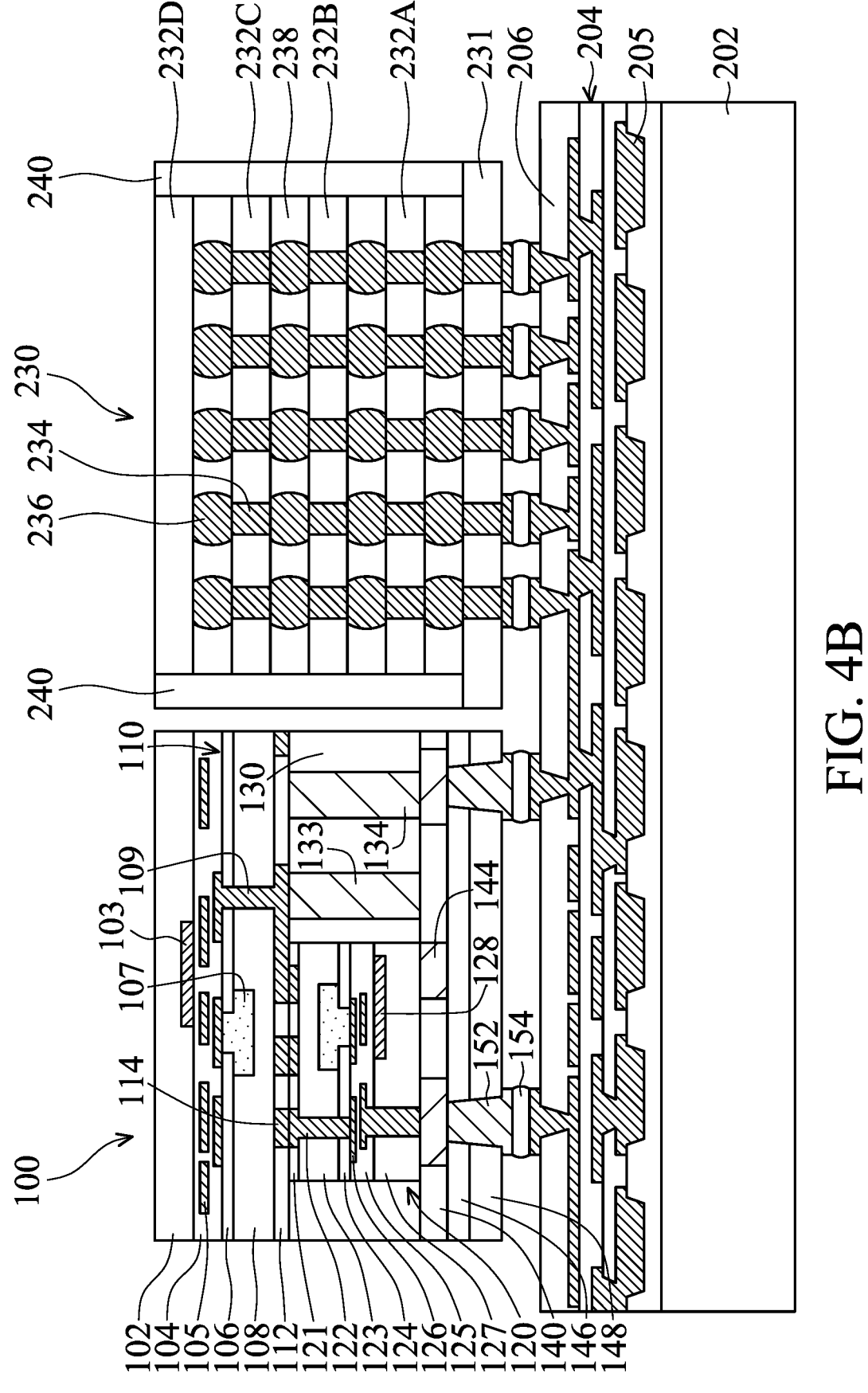

Afterwards, as shown in FIG. 4B, the semiconductor structure 100 and a stacked die package structure 230 are formed over the carrier substrate 202, in accordance with some embodiments.

In some embodiments, the stacked die package structure 230 includes a number of semiconductor dies 232A, 232B, 232C, 232D. In some embodiments, the stacked die package structure 230 and the semiconductor structure 100 may have different functions. For example, the semiconductor dies 232A, 232B, 232C, 232D may include static random access memory (SRAM) devices, dynamic random access memory (DRAM) devices, high bandwidth memory (HBM) or other memory dies. The number of the semiconductor dies 232A, 232B, 232C, 232D are not limited to four, and the number can be adjusted according to the actual application.

The semiconductor dies 232A, 232B, 232C, 232D are stacked on a buffer die (or base die) 231 that performs as a logic circuit. The semiconductor dies 232A, 232B, 232C, 232D are bonded to each other by a number of bonding structures 236. A number of through substrate vias (TSVs) 234 are formed in the semiconductor dies 232A, 232B, 232C, 232D. The signal between the semiconductor dies 232A, 232B, 232C, 232D may be transferred through the through substrate vias (TSVs) 234 and the bonding structures 236.

An underfill layer 238 is formed between the semiconductor dies 232A, 232B, 232C, 232D to protect the bonding structures 236. In some embodiments, the underfill layer 238 includes an epoxy-based resin with fillers dispersed therein. The fillers may include insulating fibers, insulating particles, other suitable elements, or a combination thereof. A molding compound 240 protects the semiconductor dies 232A, 232B, 232C, 232D. In some embodiments, the molding compound 240 may include an epoxy-based resin with fillers dispersed therein. The fillers may include insulating fibers, insulating particles, other suitable elements, or a combination thereof. In some embodiments, the size and/or density of the fillers dispersed in the underfill layer 238 is smaller than those dispersed in the molding compound 240.

Figure 4C:
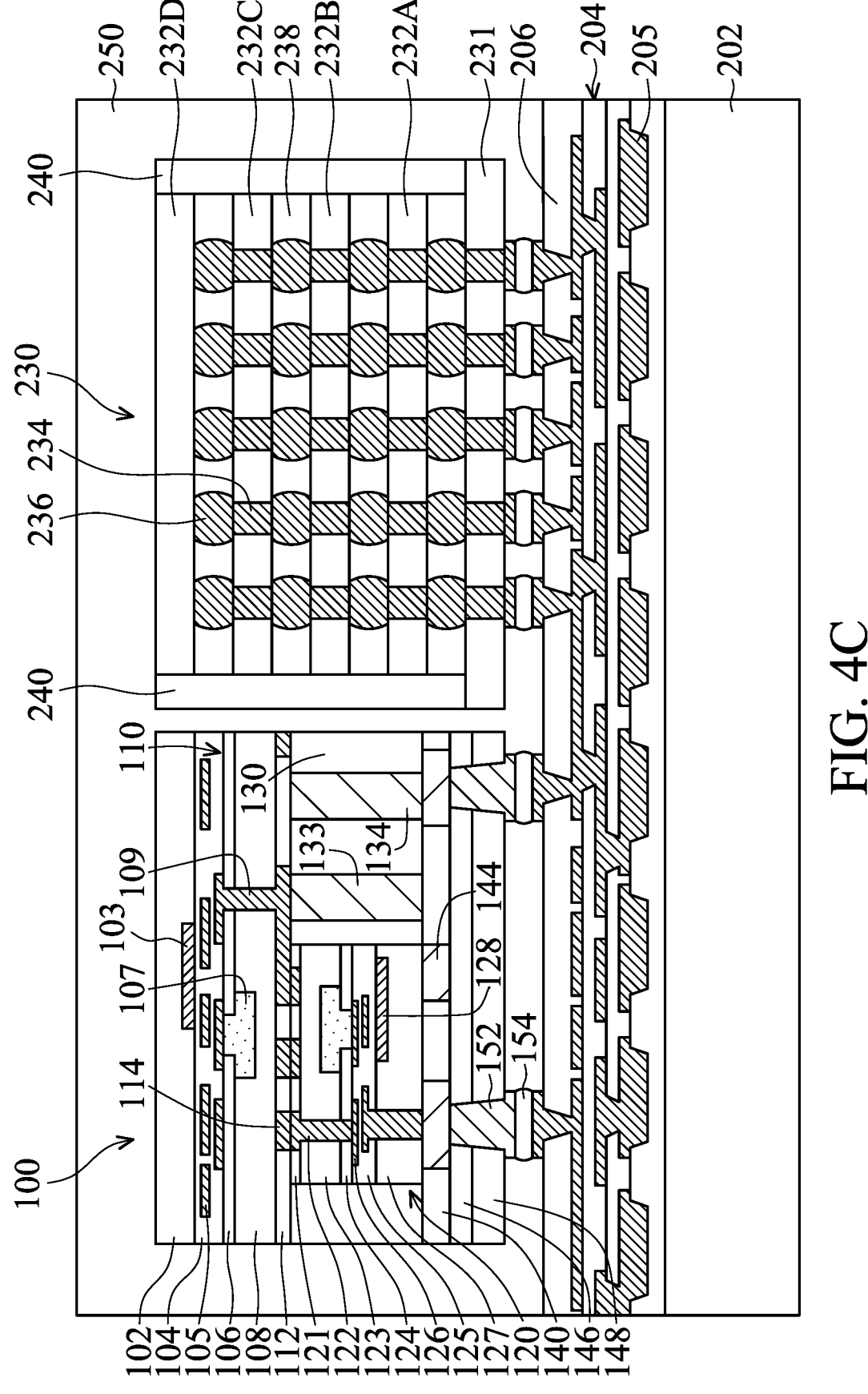

Afterwards, as shown in FIG. 4C, a package layer 250 is formed on the interconnect structure 204 to surround the semiconductor structure 100 and the stacked die package structure 230, in accordance with some embodiments. In some embodiments, the package layer 250 is made of a molding compound material. The molding compound material may include a polymer material, such as an epoxy-based resin with fillers dispersed therein, in accordance with some embodiments. In some embodiments, a liquid molding compound material is applied over the semiconductor structure 100 and the stacked die package structure 230. The liquid molding compound material may flow into a space between the semiconductor structure 100 and the stacked die package structure 230, in accordance with some embodiments. A thermal process is then used to cure the liquid molding compound material and to transform it into the package layer 250, in accordance with some embodiments.

Figure 4D:
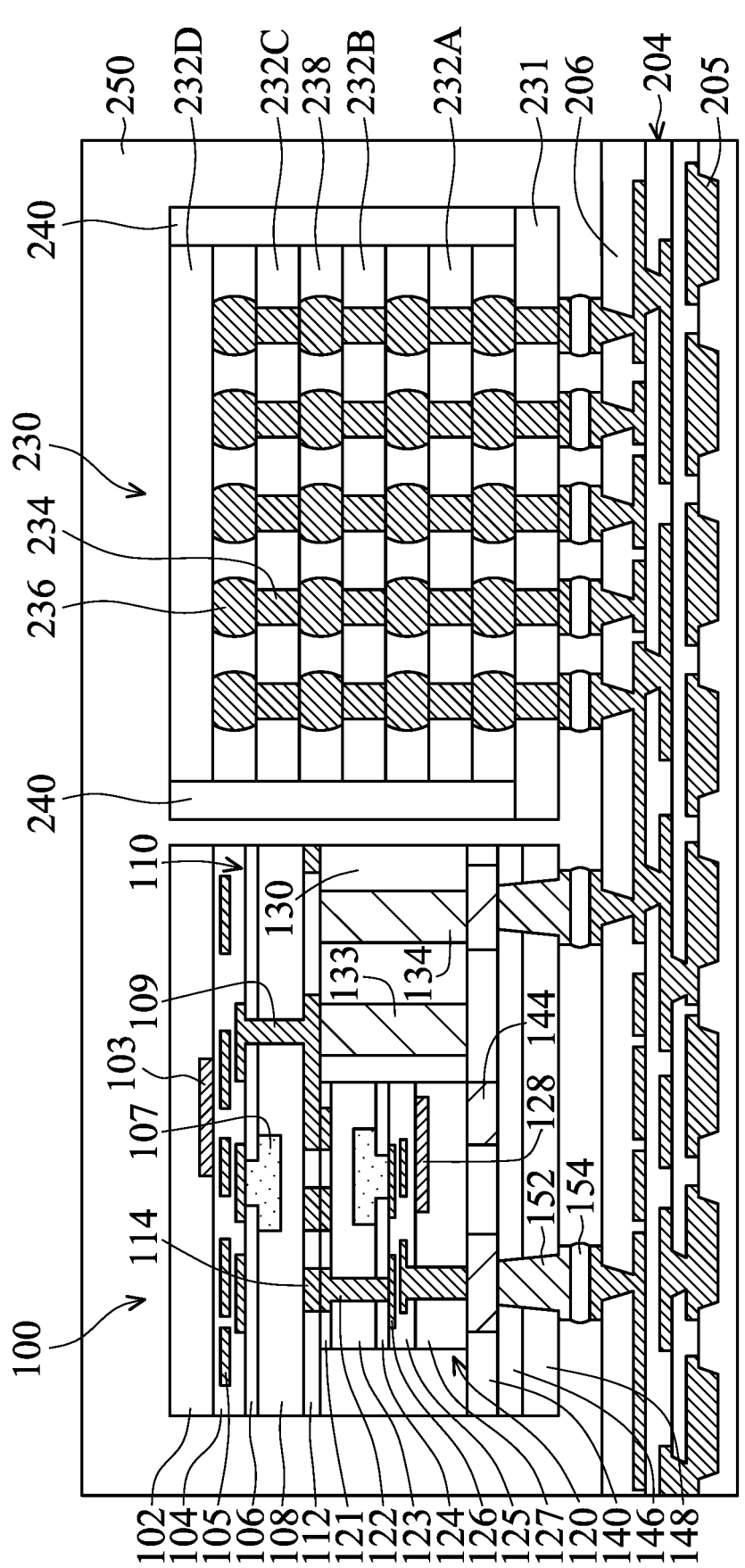
Figure 4E:
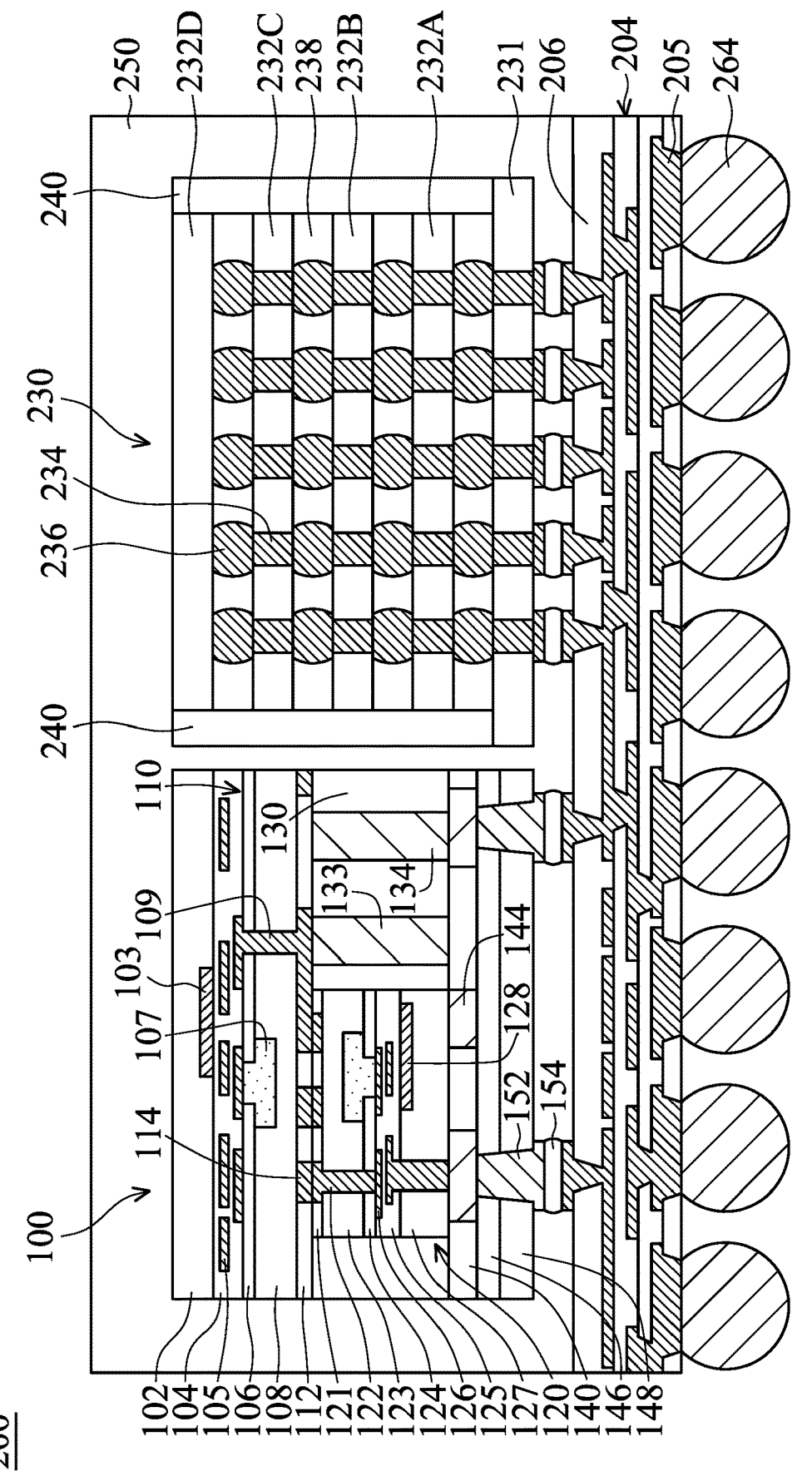

As shown in FIG. 4D, the carrier substrate 202 is removed, in accordance with some embodiments. Next, as shown in FIG. 4E, a portion of the interconnect structure 204 is removed, in accordance with some embodiments of the disclosure. As a result, the conductive layer of the interconnect structure 204 is exposed. Afterwards, a number of conductive connectors 264 are formed over the exposed conductive layer of the interconnect structure 204, in accordance with some embodiments. The conductive connectors 264 are electrically connected to the conductive layer of the interconnect structure 204. In some embodiments, the conductive connectors 264 are referred to as controlled collapse chip connection (C4) bumps. In some other embodiments, the conductive connectors 264 is micro bumps, electroless nickel-electroless palladium-immersion gold technique (ENEPIG) formed bumps, ball grid array (BGA) bumps, or the like.

Figure 5A:
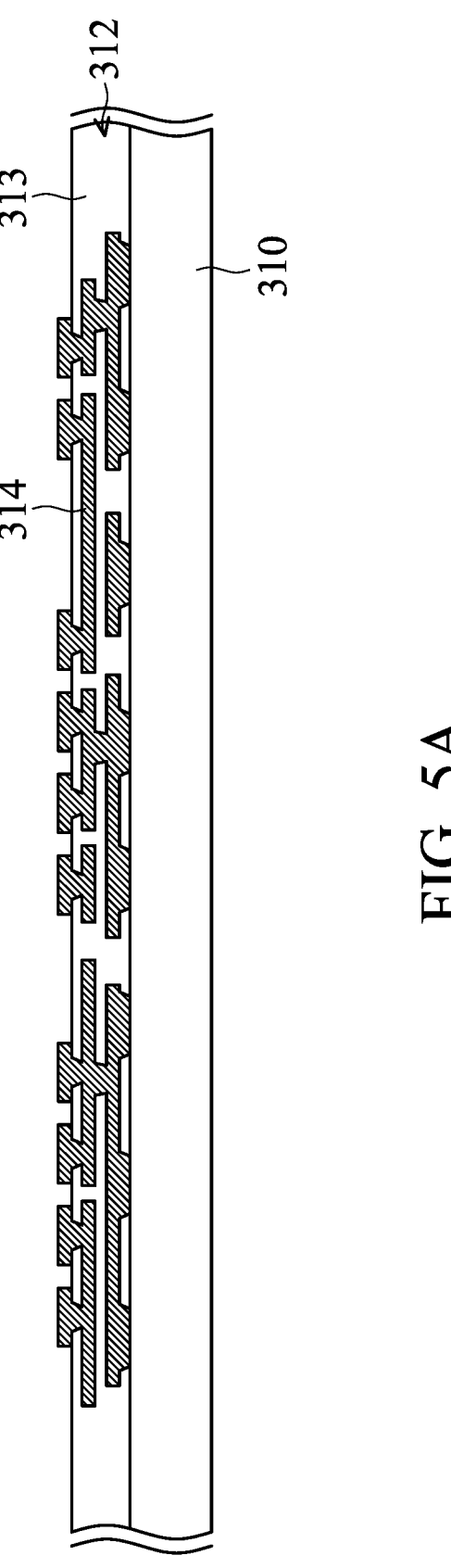
FIG. 5A to FIG. 5K show cross-sectional views of various stages of forming a package structure having the semiconductor structure described in FIG. 1A to FIG. 1J, in accordance with some embodiments of the disclosure.

FIG. 5A to FIG. 5K show cross-sectional views of various stages of forming a package structure 300 having the semiconductor structure 100 described FIG. 1A to FIG. 1J, in accordance with some embodiments of the disclosure. Referring to FIG. 5A, a first carrier substrate 310 is provided. The first carrier substrate 310 is configured to provide temporary mechanical and structural support during subsequent processing steps, in accordance with some embodiments. The first carrier substrate 310 includes glass, silicon oxide, aluminum oxide, metal, a combination thereof, and/or the like, in accordance with some embodiments. The first carrier substrate 310 includes a metal frame, in accordance with some embodiments.

An interconnect structure 312 is formed over the first carrier substrate 310. The interconnect structure 312 may be used as a redistribution (RDL) structure for routing. The interconnect structure 312 includes multiple dielectric layers 313 and multiple conductive layers 314, in accordance with some embodiments. In some embodiments, some of the conductive layers 314 are exposed at or protruding from the top surface of the top of the dielectric layers 313. The exposed or protruding conductive layers 314 may serve as bonding pads where conductive bumps (such as tin-containing solder bumps) and/or conductive pillars (such as copper pillars) will be formed later, in accordance with some embodiments.

Figure 5B:
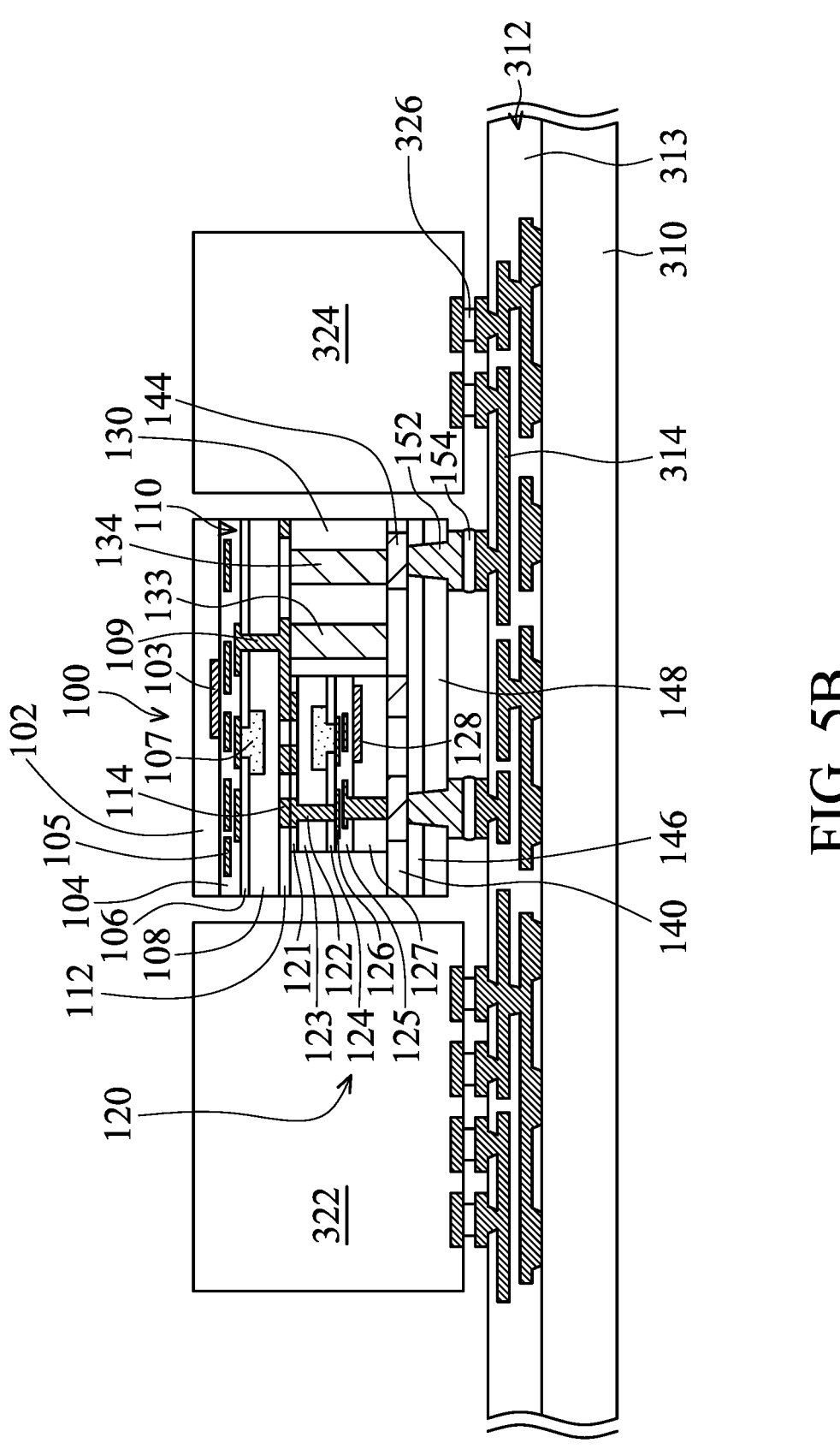

Afterwards, as shown in FIG. 5B, the semiconductor structure 100, a first stacked die package structure 322, and a second stacked die package structure 324 are formed over the first carrier substrate 310, in accordance with some embodiments. In some embodiments, the semiconductor structure 100 is between the first stacked die package structure 322 and the second stacked die package structure 324. In some embodiments, the semiconductor structure 100, the first stacked die package structure 322, and the second stacked die package structure 324 are bonded to the interconnect structure 312 by bonding structures 326. In some embodiments, the conductive connector 326 is made of solder materials, such as tin (Sn), SnAg, SnPb, SnAgCu, SnAgZn, SnZn, SnBiIn, SnIn, SnAu, SnPb, SnCu, SnZnIn, SnAgSb or another applicable material. In some embodiments, the conductive connector 326 is formed by electroplating, electroless plating, printing, chemical vapor deposition (CVD) process or physical vapor deposition (PVD) process.

In some embodiments, the first stacked die package structure 322 and the second stacked die package structure 324 and the semiconductor structure 100 may have different functions. For example, the first stacked die package structure 322 and the second stacked die package structure 324 may include static random access memory (SRAM) devices, dynamic random access memory (DRAM) devices, high bandwidth memory (HBM) or other memory dies.

Figure 5C:
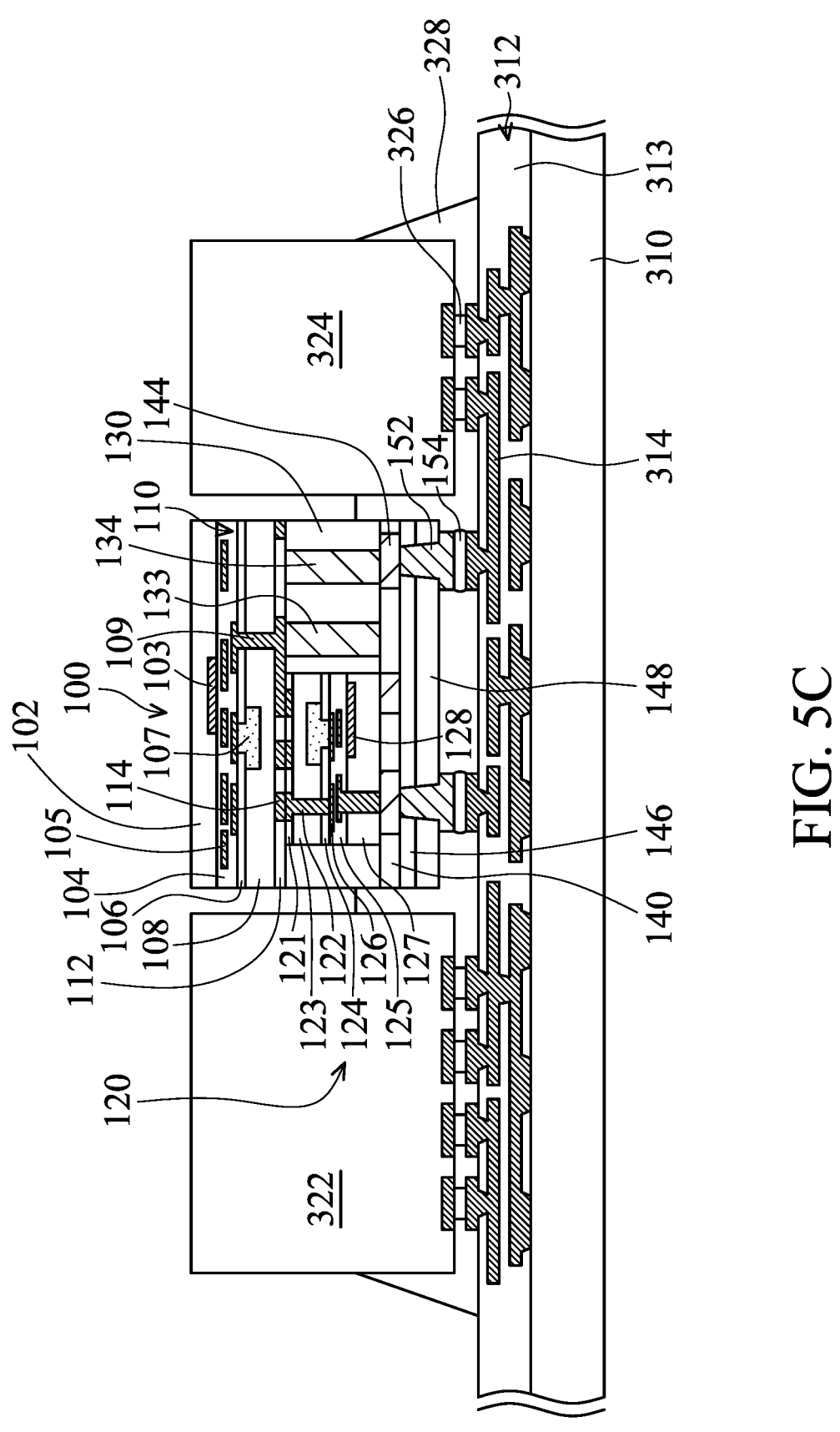

As shown in FIG. 5C, an underfill layer 328 is formed between the semiconductor structure 100, the first stacked die package structure 322, and the second stacked die package structure 324 to protect the bonding structures 326. In some embodiments, the underfill layer 328 includes an epoxy-based resin with fillers dispersed therein. The fillers may include insulating fibers, insulating particles, other suitable elements, or a combination thereof.

Figure 5D:
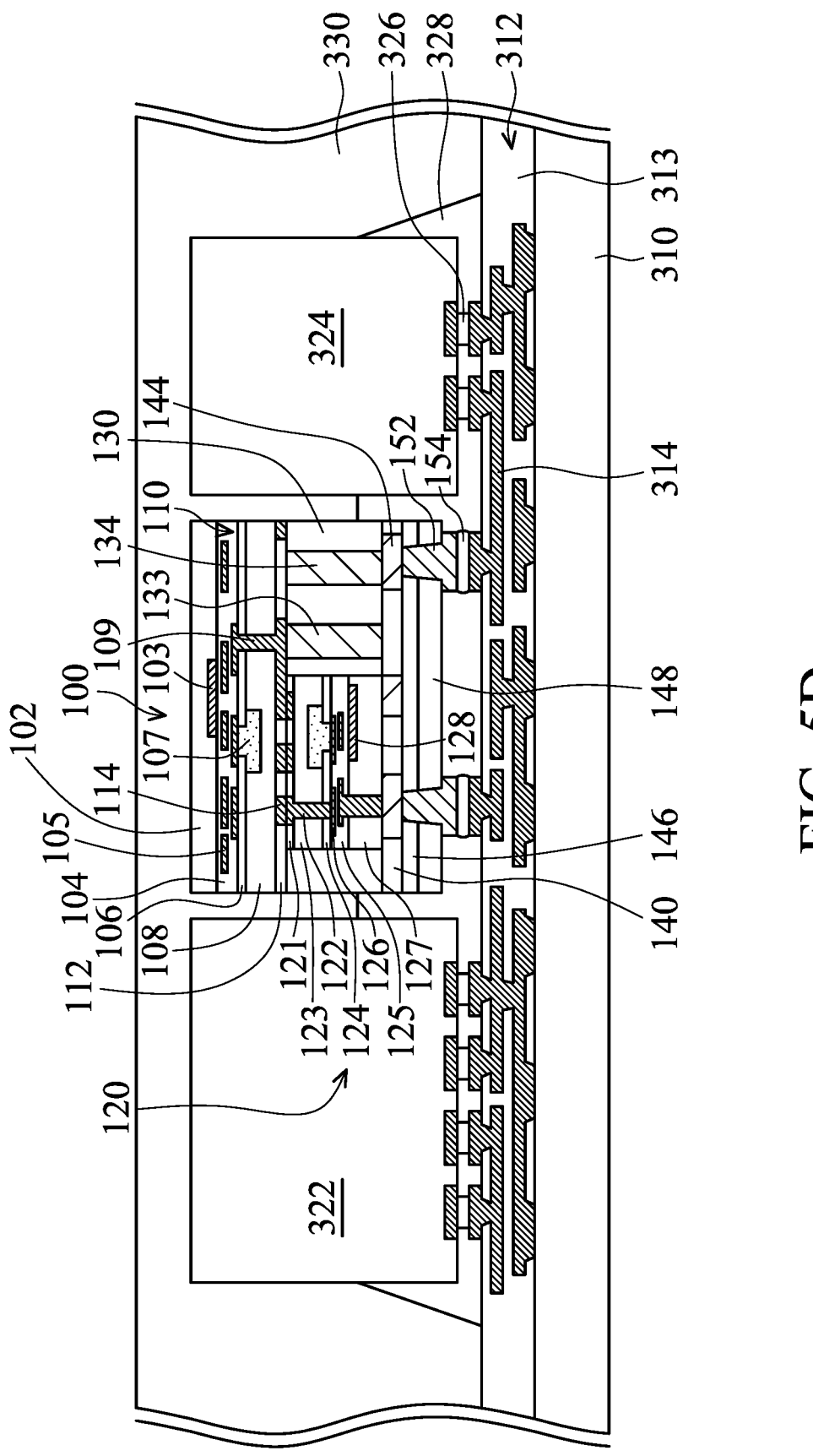

Afterwards, as shown in FIG. 5D, a package layer 330 is formed over the underfill layer 328. In some embodiments, the package layer 330 is made of a molding compound material. The molding compound material may include a polymer material, such as an epoxy-based resin with fillers dispersed therein. In some embodiments, a liquid molding compound material is applied over the semiconductor structure 100, the first stacked die package structure 322, and the second stacked die package structure 324. The liquid molding compound material may flow into a space between the semiconductor structure 100, the first stacked die package structure 322, and the second stacked die package structure 324. A thermal process is then used to cure the liquid molding compound material and to transform it into the package layer 330.

Figure 5E:
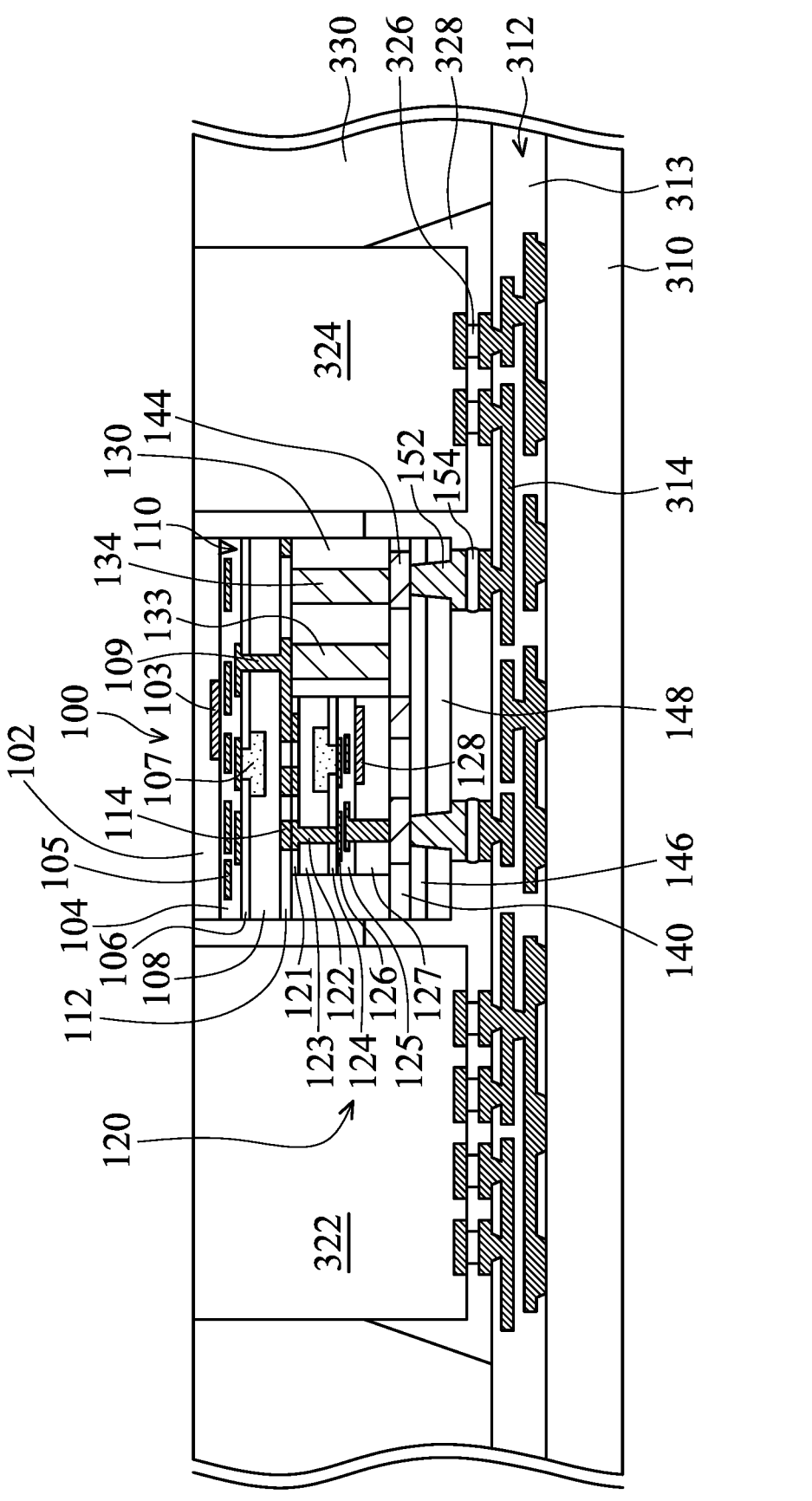

In FIG. 5E, a planarization process is applied to remove a portion of the package layer 330, so that the top surfaces of the semiconductor structure 100, the first stacked die package structure 322, and the second stacked die package structure 324 are exposed from the package layer 330, in accordance with some embodiments. In some embodiments, the planarization process may include a grinding process, a chemical mechanical polishing (CMP) process, an etching process, a dry polishing process, one or more other applicable processes, or a combination thereof.

Figure 5F:
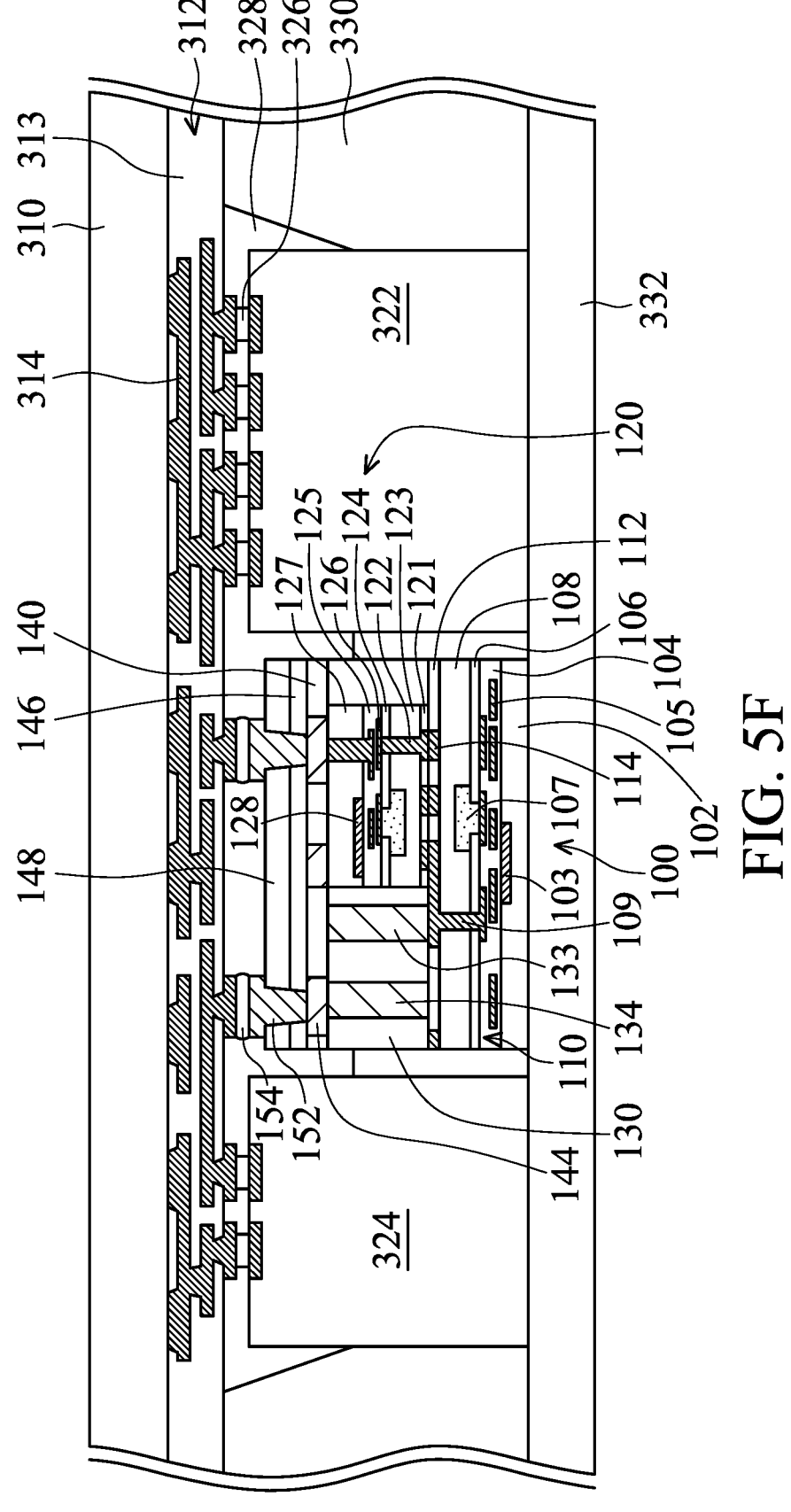

Next, in FIG. 5F, the entire structure is disposed on a second carrier substrate 332, in accordance with some embodiments. The second carrier substrate 332 is configured to provide temporary mechanical and structural support during subsequent processing steps, in accordance with some embodiments. The second carrier substrate 332 includes glass, silicon oxide, aluminum oxide, metal, a combination thereof, and/or the like, in accordance with some embodiments. The second carrier substrate 332 includes a metal frame, in accordance with some embodiments.

Figure 5G:
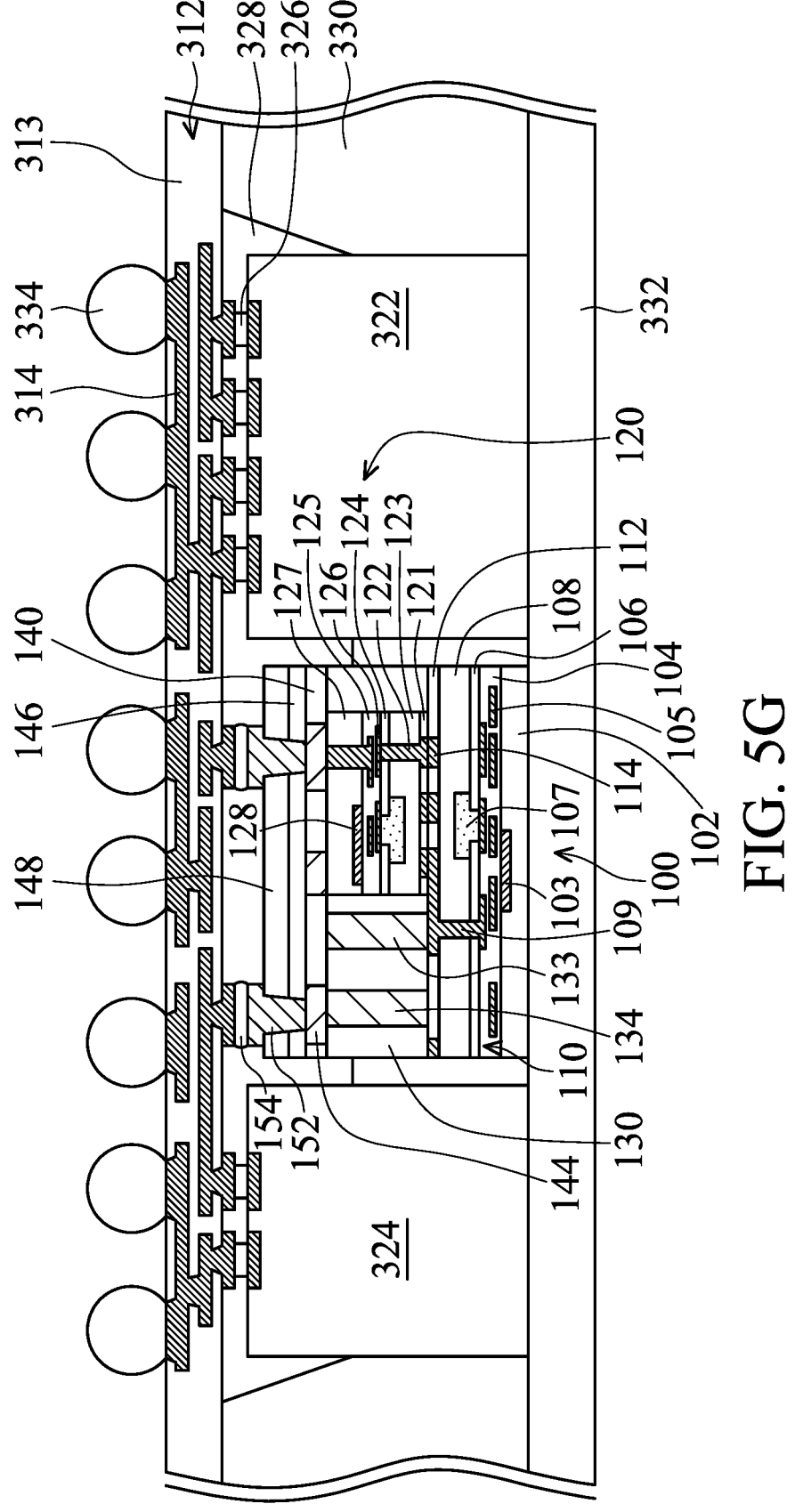

In FIG. 5G, the first carrier substrate 310 is removed, a portion of the interconnect structure 312 is removed to expose the conductive layer of the interconnect structure 312. Afterwards, a number of conductive connectors 334 are formed over the exposed conductive layer of the interconnect structure 312, in accordance with some embodiments. The conductive connectors 334 are electrically connected to the conductive layer of the interconnect structure 312. In some embodiments, the conductive connectors 334 are referred to as controlled collapse chip connection (C4) bumps. In some other embodiments, the conductive connectors 334 is micro bumps, electroless nickel-electroless palladium-immersion gold technique (ENEPIG) formed bumps, ball grid array (BGA) bumps, or the like.

Figure 5H:
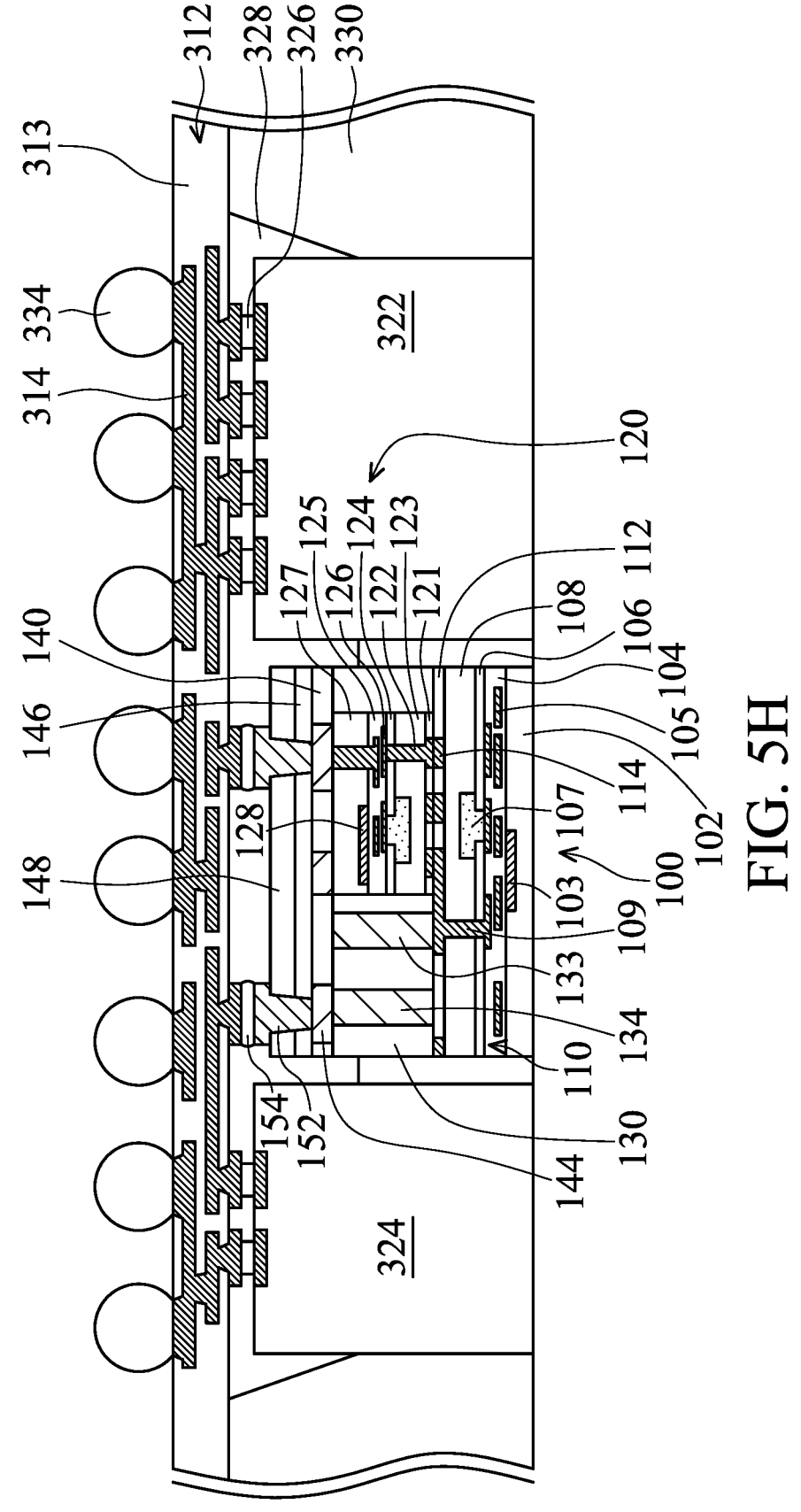
Figure 5I:
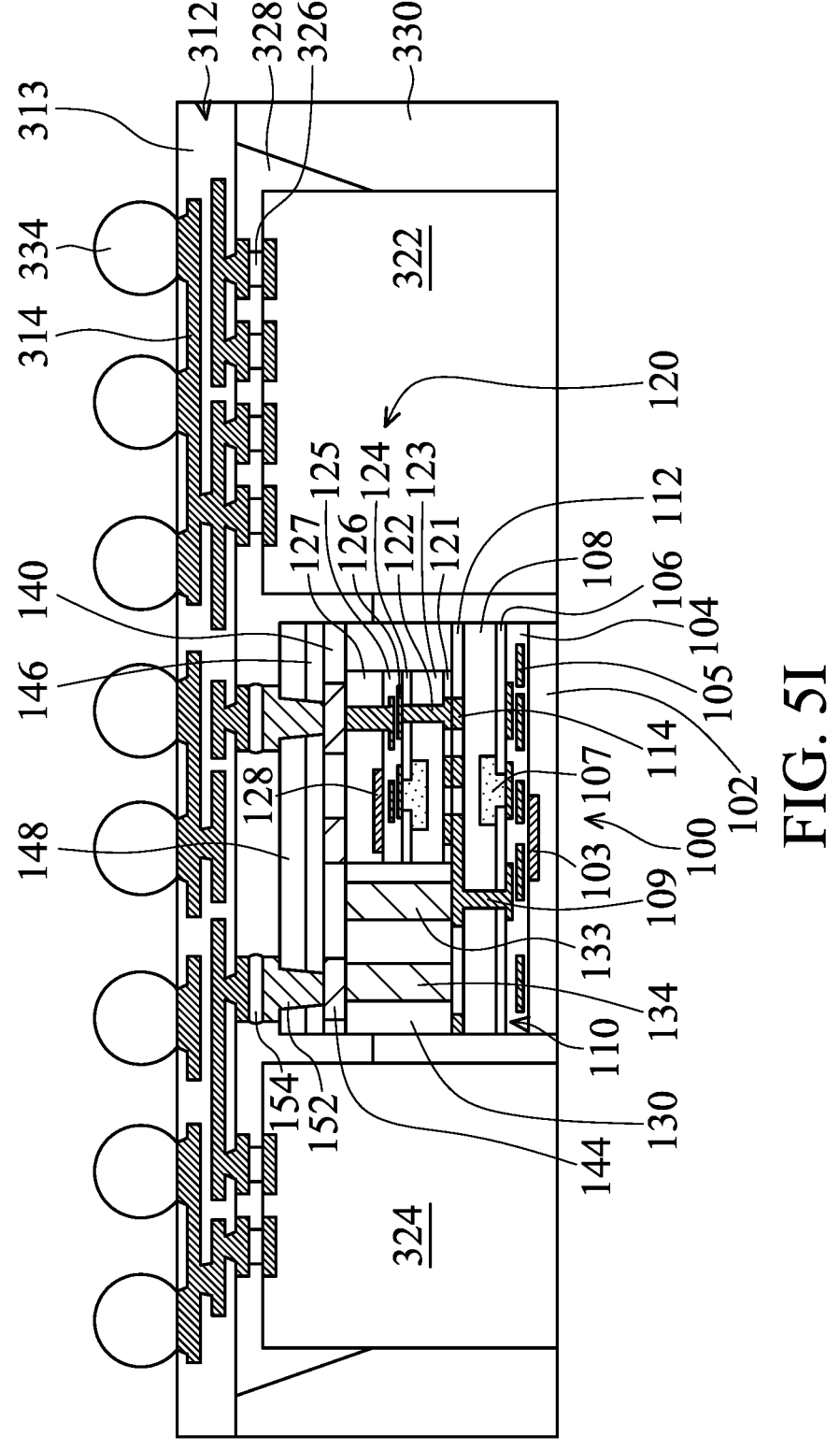

Next, as shown in FIG. 5H, the second carrier substrate 332 is removed. Subsequently, as shown in FIG. 5I, a singulation process is performed to separate the wafer-level package structure into multiple die-level package structure. In some embodiments, the singulation process is a dicing process.

Figure 5J:
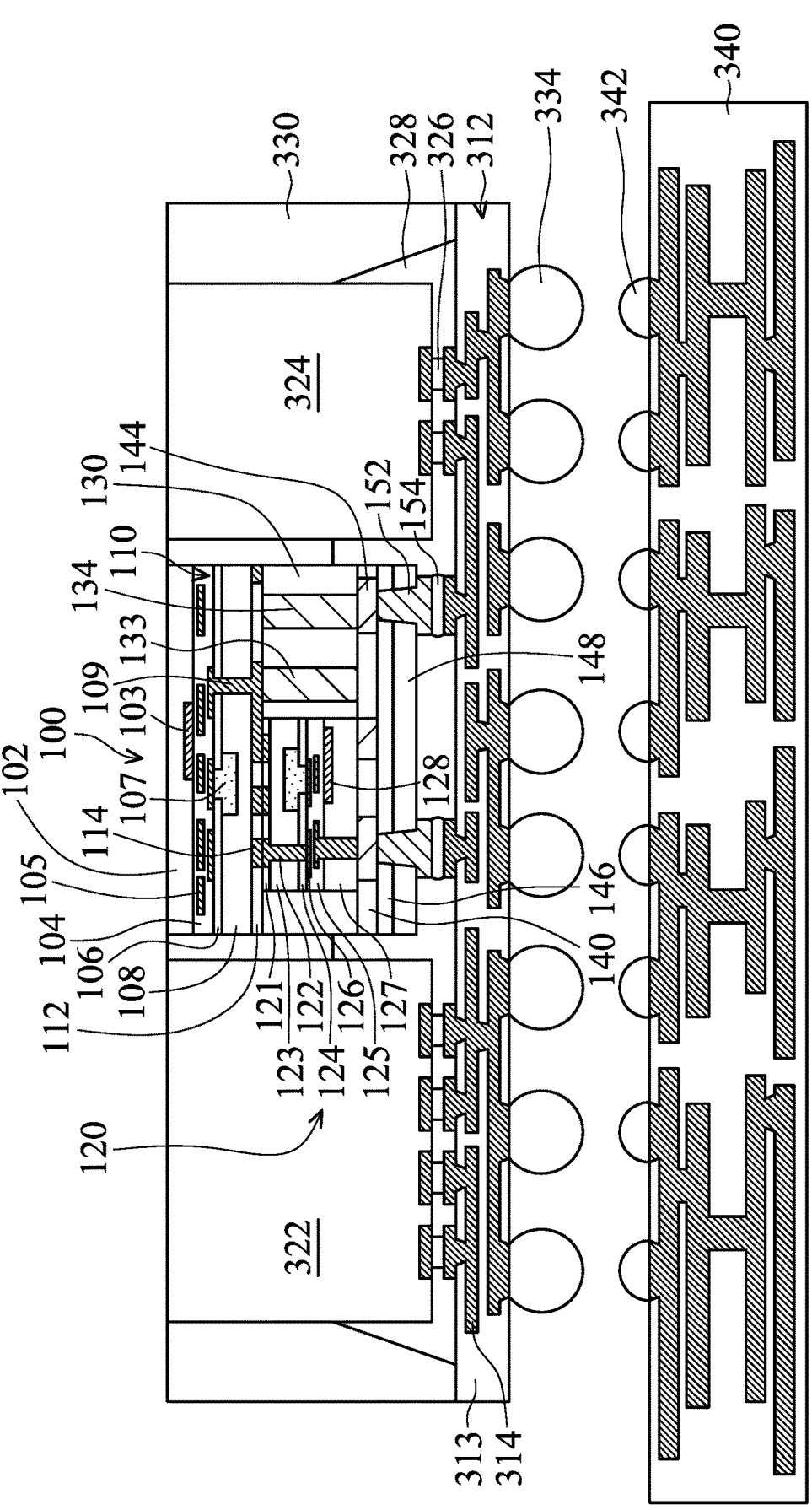

As shown in FIG. 5J, the structure in FIG. 5I is disposed on an interposer substrate 340 through the conductive connectors 334 and conductive connectors 342 (which refer as conductive connectors 344 later), in accordance with some embodiments. The conductive connectors 342 may include solder bumps, conductive pillars, other suitable conductive elements, or a combination thereof. In some embodiments, the interposer substrate 340 includes a board and conductive elements. The conductive elements may be made of or include copper, aluminum, cobalt, nickel, gold, silver, tungsten, one or more other suitable materials, or a combination thereof. The board may be made of or include a polymer material, a ceramic material, a metal material, a semiconductor material, one or more other suitable materials, or a combination thereof. For example, the board includes resin, prepreg, glass, and/or ceramic. In cases where the board is made of a metal material or a semiconductor material, dielectric layers may be formed between the board and the conductive elements to prevent short circuiting.

Figure 5K:
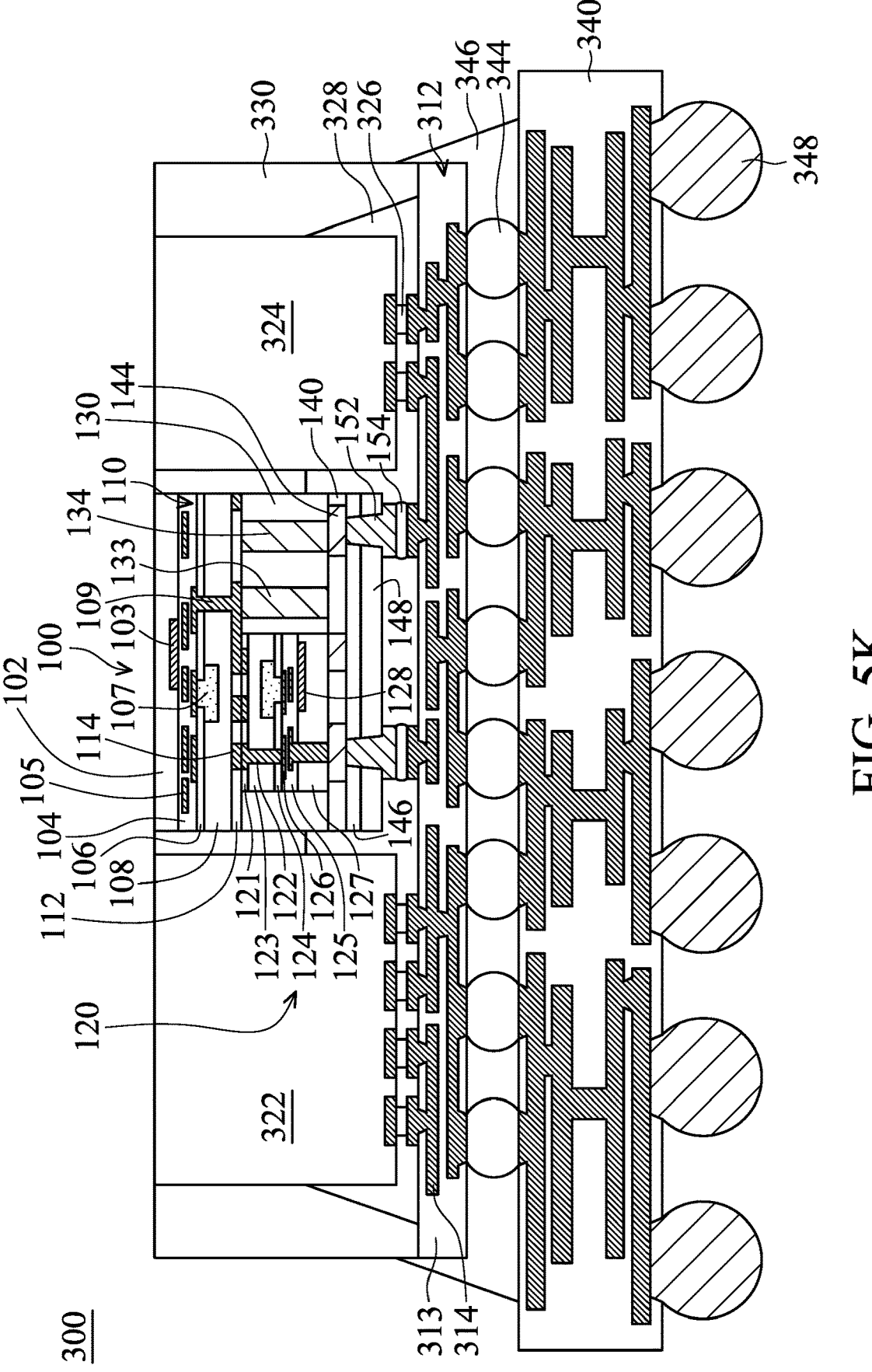

In some embodiments, as shown in FIG. 5K, an underfill layer 346 is formed to surround and protect the conductive connectors 344. In some embodiments, the underfill layer 346 includes an epoxy-based resin with fillers dispersed therein. The fillers may include insulating fibers, insulating particles, other suitable elements, or a combination thereof. In some embodiments, a portion of the interconnect structure 340 is removed, in accordance with some embodiments of the disclosure. As a result, the conductive layer of the interconnect structure 340 is exposed. Afterwards, a number of conductive connectors 348 are formed over the exposed conductive layer of the interconnect structure 340 to form the package structure 300, in accordance with some embodiments. The conductive connectors 348 are electrically connected to the conductive layer of the interconnect structure 340. In some embodiments, the conductive connectors 348 are referred to as controlled collapse chip connection (C4) bumps. In some other embodiments, the conductive connectors 348 is micro bumps, electroless nickel-electroless palladium-immersion gold technique (ENEPIG) formed bumps, ball grid array (BGA) bumps, or the like.

In summary, a semiconductor structure and a method for forming the same are provided in some embodiments of the present disclosure. In some embodiments, the semiconductor structure includes a chip and a finger-typed capacitor formed in a dielectric layer, and the capacitor includes simultaneously formed vias act as different electrodes, so no additional mask is required to form the electrodes. Such configuration has relatively shorter interconnect length (and time delay), which will be much more suitable for future advanced portable products, in accordance with some embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor structure is provided in some embodiments. The semiconductor structure includes a substrate, a first conductive layer formed on the substrate, a chip disposed on the substrate, a first dielectric layer surrounding the chip, a second conductive layer disposed on the first dielectric layer and electrically insulated from the first conductive layer, a plurality of first vias formed in the first dielectric layer and electrically connected to the first conductive layer, and a plurality of second vias formed in the first dielectric layer and electrically connected to the second conductive layer. In some embodiments, the first vias are arranged in a first direction. In some embodiments, the second vias are arranged in the first direction, and the first vias and the second vias are arranged in a staggered fashion in a second direction. The second direction is different from the first direction.

A semiconductor structure is provided in some embodiments. The semiconductor structure includes a substrate, a chip disposed on the substrate, a first dielectric layer disposed on the substrate, and a first via array disposed in the first dielectric layer. In some embodiments, the first via array includes a first via column extending in a first direction, a second via column extending in the first direction and electrically insulated from the first via column, a third via column extending in the first direction and electrically connected to the first via column, and a fourth via column extending in the first direction and electrically connected to the second via column. In some embodiments, the first via column, the second via column, the third via column, and the fourth via column are sequentially arranged with each other.

A method for forming a semiconductor structure in some embodiments. The method includes forming a first conductive layer on a substrate. The method includes disposing a chip on the substrate, wherein the chip is electrically connected to the first conductive layer. The method includes disposing a first dielectric layer on the substrate. The method includes simultaneously forming a first via structure and a second via structure in the first dielectric layer. The first via structure is electrically connected to the first conductive layer, and the second via structure is electrically insulated from the first conductive layer. The method includes disposing a second dielectric layer on the first dielectric layer. The method includes forming a second conductive layer in the second dielectric layer. The first via structure is electrically insulated from the second conductive layer, the second via structure is electrically connected to the second conductive layer, and the first via structure and the second via structure are electrically insulated from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a first conductive layer formed on the substrate and comprising a first opening;
a chip disposed on the substrate;
a first dielectric layer surrounding the chip;
a second conductive layer disposed on the first dielectric layer and electrically insulated from the first conductive layer, and comprising a second opening;
a plurality of first vias formed in the first dielectric layer, between the first conductive layer and the second conductive layer, and electrically connected to the first conductive layer, wherein the first vias are arranged in a first direction and extending in an extending direction, and the first vias overlaps the second opening in the extending direction; and
a plurality of second vias formed in the first dielectric layer, between the first conductive layer and the second conductive layer, and electrically connected to the second conductive layer, wherein the second vias are arranged in the first direction, and the first vias and the second vias are arranged in a staggered fashion in a second direction different from the first direction, wherein the second vias overlaps the first opening in the extending direction.

2. The semiconductor structure as claimed in claim 1, further comprising:
a plurality of third vias formed in the first dielectric layer and electrically connected to the first conductive layer; and
a plurality of fourth vias formed in the first dielectric layer and electrically connected to the second conductive layer, wherein the second vias are between the first vias and the third vias, and the third vias are between the second vias and the fourth vias.

3. The semiconductor structure as claimed in claim 2, wherein a first distance is between the first vias and the second vias in the second direction, a second distance is between the second vias and the third vias in the second direction, and the first distance and the second distance are different.

4. The semiconductor structure as claimed in claim 3, wherein a third distance is between the third vias and the fourth vias in the second direction, and the third distance is different from the first distance and the second distance.

5. The semiconductor structure as claimed in claim 1, wherein each of the first vias has a first height and a first width, and a ratio of the first height to the first width is between 4 and 250.

6. The semiconductor structure as claimed in claim 1, further comprising:
a second dielectric layer disposed on the substrate and in contact with the second vias, wherein the first conductive layer is disposed in the second dielectric layer; and
a third dielectric layer disposed on the substrate and in contact with the first vias, wherein the second conductive layer is disposed in the second third dielectric layer.

7. The semiconductor structure as claimed in claim 6, wherein the second dielectric layer is spaced apart from the first vias, and the third dielectric layer is spaced apart from the second vias.

8. A semiconductor structure, comprising:
a substrate;
a first conductive layer formed on the substrate;
a chip disposed on the substrate;
a first dielectric layer surrounding the chip;
a second conductive layer disposed on the first dielectric layer and electrically insulated from the first conductive layer, wherein the first dielectric layer is disposed between the first conductive layer and the second conductive layer;
a plurality of first vias formed in the first dielectric layer and electrically connected to the first conductive layer, wherein the first vias are arranged in a first direction, and the first vias comprises a first via column and a third via column extending in a second direction different from the first direction; and
a plurality of second vias formed in the first dielectric layer and electrically connected to the second conductive layer, wherein the second vias are arranged in the first direction, and the second vias comprises a second via column and a fourth via column extending in the second direction, wherein the first via column, the second via column, the third via column, and the fourth via column are arranged in sequence in a third direction different form the first direction and the second direction;
wherein in a top view, the first vias are spaced apart from the second vias;
wherein in the third direction, the first vias overlaps the second vias.

9. The semiconductor structure as claimed in claim 8, wherein numbers of vias in the first via column, in the second via column, in the third column, and in the fourth column are identical.

10. The semiconductor structure as claimed in claim 8, further comprising a plurality of third vias disposed on the substrate and electrically insulated from the first vias and the second vias.

11. The semiconductor structure as claimed in claim 10, wherein the third vias comprise a fifth via column extending in the second direction, the first via column and the fifth via column are arranged in the first direction, and the numbers of vias in the first via column is different from numbers of vias in the fifth via column.

12. The semiconductor structure as claimed in claim 8, wherein in the second direction, a first distance is between the first via column and the second via column, a second distance is between the second via column and the third via column, and the first distance is shorter than the second distance.

13. The semiconductor structure as claimed in claim 12, wherein in the second direction, a third distance is between the third via column and the fourth via column, and the first distance is shorter than the third distance.

14. The semiconductor structure as claimed in claim 13, wherein the second distance is shorter than the third distance.

15. The semiconductor structure as claimed in claim 8, wherein a first voltage is coupled to the first via column and the third via column, a second voltage is coupled to the second via column and the fourth via column, and the first voltage and the second voltage are different.

16. A semiconductor structure, comprising:
a substrate;
a first conductive layer disposed on the substrate;
a chip disposed on the substrate, wherein the chip is electrically connected to the first conductive layer;
a first dielectric layer disposed on the substrate and having a first surface and a second surface opposite from each other;
a second dielectric layer disposed on the first dielectric layer;
a second conductive layer disposed in the second dielectric layer, wherein the chip is electrically connected to the second conductive layer;

a plurality of first vias disposed in the first dielectric layer, extending from the first surface to the second surface, electrically connected to the first conductive layer, and electrically insulated from the second conductive layer; and
a plurality of second vias disposed in the first dielectric layer, extending from the first surface to the second surface, electrically insulated from the first conductive layer, and electrically connected to the second conductive layer, wherein the first via structure and the second via structure are electrically insulated from each other.

17. The semiconductor structure as claimed in claim 16, further comprising:
a third dielectric layer disposed over the second dielectric layer; and
a conductive structure disposed in the third dielectric layer and connected to the second conductive layer.

18. The semiconductor structure as claimed in claim 16, wherein the chip is in direct contact with the substrate.

19. The semiconductor structure as claimed in claim 16, further comprising a capacitor, wherein the capacitor comprises:
a first electrode formed by the first conductive layer and the first via structure;
a second electrode formed by the second conductive layer and the second via structure; and
a dielectric material formed by the first dielectric layer between the first electrode and the second electrode.

20. The semiconductor structure as claimed in claim 19, wherein a capacitance of the capacitor is between 100 fF and 800 nF.

* * * * *